(12) United States Patent
Zhong et al.

(10) Patent No.: US 10,731,075 B2
(45) Date of Patent: Aug. 4, 2020

(54) PEROVSKITE QUANTUM DOT MATERIAL

(71) Applicant: SHENZHEN TCL NEW TECHNOLOGY CO., LTD, Shenzhen, Guangdong (CN)

(72) Inventors: Haizheng Zhong, Guangdong (CN); Feng Zhang, Guangdong (CN); Xiangang Wu, Guangdong (CN); Hailong Huang, Guangdong (CN); Yuwei Niu, Guangdong (CN)

(73) Assignee: SHENZHEN TCL NEW TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 16/824,631

(22) Filed: Mar. 19, 2020

(65) Prior Publication Data
US 2020/0216754 A1 Jul. 9, 2020

Related U.S. Application Data

(63) Continuation of application No. 15/584,042, filed on May 2, 2017, now Pat. No. 10,633,584, which is a continuation of application No. PCT/CN2015/092497, filed on Oct. 22, 2015.

(30) Foreign Application Priority Data

Nov. 4, 2014 (CN) .......................... 2014 1 0612348

(51) Int. Cl.
| | |
|---|---|
| C09K 11/06 | (2006.01) |
| C09K 11/66 | (2006.01) |
| C09K 11/61 | (2006.01) |
| C09K 11/87 | (2006.01) |
| C09K 11/02 | (2006.01) |
| C09K 11/75 | (2006.01) |
| B01D 17/04 | (2006.01) |
| B01J 13/08 | (2006.01) |
| H01L 51/00 | (2006.01) |
| H01L 51/50 | (2006.01) |
| H01L 51/52 | (2006.01) |
| H01L 33/50 | (2010.01) |

(52) U.S. Cl.
CPC ............ *C09K 11/06* (2013.01); *B01D 17/047* (2013.01); *B01J 13/08* (2013.01); *C09K 11/02* (2013.01); *C09K 11/025* (2013.01); *C09K 11/61* (2013.01); *C09K 11/66* (2013.01); *C09K 11/664* (2013.01); *C09K 11/75* (2013.01); *C09K 11/87* (2013.01); *H01L 33/50* (2013.01); *H01L 51/0077* (2013.01); *H01L 51/502* (2013.01); *H01L 51/5206* (2013.01); *H01L 51/5234* (2013.01); *C09K 2211/10* (2013.01); *C09K 2211/188* (2013.01); *H01L 51/0003* (2013.01); *H01L 51/5056* (2013.01); *H01L 51/5072* (2013.01); *H01L 2251/301* (2013.01); *H01L 2251/308* (2013.01)

(58) Field of Classification Search
CPC ....... C09K 11/06; C09K 11/02; C09K 11/025; C09K 11/61; C09K 11/66; C09K 11/664; C09K 11/75; C09K 11/87; C09K 11/2211; C09K 11/10; C09K 2211/188; B01D 17/047; B01J 13/08; H01L 33/50; H01L 51/0077; H01L 51/502; H01L 51/5206; H01L 51/5234; H01L 51/0003; H01L 51/5056; H01L 51/5072; H01L 2251/301; H01L 2251/308
USPC ..................................... 252/301.16
See application file for complete search history.

(56) References Cited

U.S. PATENT DOCUMENTS 10,633,584 B2 * 4/2020 Zhong ................. B01D 17/047

* cited by examiner

Primary Examiner — Edward M Johnson

(57) ABSTRACT

Provided is a hybridized perovskite quantum dot material. The quantum dot material includes a kernel and surface ligands. The kernel is formed by $R_1NH_3AB_3$ or $(R_2NH_3)_2AB_4$, where $R_1$ is methyl group, $R_2$ is an organic molecular group, A is at least one selected from Ge, Sn, Pb, Sb, Bi, Cu and Mn, B is at least one selected from Cl, Br and I, A and B form a coordination octahedral structure, and $R_1NH_3$ or $R_2NH_3$ is filled in gaps of the coordination octahedral structure. The surface ligand is an organic acid or organic amine. The quantum dot material has a high fluorescence quantum yield.

11 Claims, 7 Drawing Sheets

PEROVSKITE QUANTUM DOT MATERIAL

CROSS REFERENCE TO RELATED APPLICATIONS

The present application is a Continuation Application of U.S. patent application Ser. No. 15/584,042 filed on May 2, 2017, which is a Continuation Application of PCT application No. PCT/CN2015/092497 filed on Oct. 22, 2015, which in turn claims the benefit of Chinese Patent Application No. 201410612348.6 filed on Nov. 4, 2014. All the above are hereby incorporated by reference.

TECHNICAL FIELD

The present invention relates to material field, and in particular to a perovskite quantum dot material and preparation method thereof.

BACKGROUND

The general chemical formula of ideal inorganic perovskite is $ABX_3$, in which, the central metal cationic B and anion X form an octahedral structure. A filled in gaps of the octahedral structure is configured for equilibrating charge of the anion $BX_3$. For a typical three-dimensional perovskite structure, when extracting several octahedral layers from the three-dimensional structure along a certain direction, or replacing several octahedral layers with other components, then layered perovskite structure could appear. Organic-inorganic hybridized perovskite material is formed by replacing atoms at A site on the inorganic perovskite with organic amine, the organic amine is filled in gaps of each octahedral structure. Octahedral structures may be connected with each other to form a network structure via a common vertex. The organic amine may enter into the inorganic spatial by means of hydrogen bonds formed by hydrogens at the organic amine and halide ions. The organic chains are interacted with each other by Van Der Waals force to form a hybrid structure having alternating organic and inorganic layers. For the hybridized perovskite structure, the organic amine filled in the gaps of the inorganic octahedral structure needs to satisfy the restriction of the tolerance factor t: $(R_A+R_X)=t\sqrt{2}(R_B+R_X)$, $R_A$ is radius of A atoms, $R_B$ and $R_X$ are radii of corresponding element atoms. When the tolerance factor t is in the range of $0.8 \leq t \leq 0.9$, the three-dimensional perovskite structure is formed. Therefore, the radii of A. B and X atoms determine whether the organic amine chains can be filled in the gaps. For the hybridized perovskite structure in which the lead halide and tin halide form inorganic layers, being capable of forming the three-dimensional structure of short-chain amine, such as $CH_3NH_3MX_3$(M=Pb, Sn) and $NH_2CH=NH_2SnI_3$.

Organic-inorganic hybridized perovskite material combines the advantages of organic materials and inorganic materials on the molecular scale, not only having good thermal stability, mechanical property and electromagnetic property of the inorganic materials, but also being easily processed into a film. A quantum well structure is formed by alternately stacking the unique inorganic and organic layers of the organic-inorganic hybridized perovskite material enable the hybridized perovskite material to have a relatively high excitation binding energy under dual effects of the quantum confinement and electric confinement, with the features of showing a distinct optical characteristics such as high charge carrier mobility and strong room-temperature photoluminescence, and having a relatively narrow half-peak width and high luminous purity. Furthermore, by controlling amount of organic materials and inorganic materials, the luminescence property of the hybridized perovskite material can be controlled. Therefore, the hybridized perovskite material has unique application value in the fields of field effect transistors, solar batteries, electro-luminescence, display devices and so on. Because of the unique property and application value of the hybridized perovskite material, the research on this kind of material has been drawn wide attention of researchers in recent years.

When size of the organic-inorganic hybridized perovskite material is decreased to the nanometer scale, because quantum dot has a small size and owns surface ligands, the quantum dot may easily diffuse into common solutions, enabling the hybridized perovskite material to be processed and applied easily. Therefore, the hybridized perovskite material may be applied in electro-optic fields through various ways. Meanwhile, due to its quantum confinement effect of the quantum dot, the organic-inorganic hybridized perovskite quantum dot shows more excellent property than bulk materials, such as a stronger luminescence intensity and higher quantum yield, and its luminescence wavelength can be adjusted by controlling the size of namo-particles. Compared to inorganic quantum dot material, the half-peak width of the organic-inorganic hybridized perovskite quantum dot is narrower and its luminescence purity is higher, which has big advantages in high performance display devices. The hybridized perovskite material could be a potential material for making laser. Additionally, its layered self-assembly structure enables the hybridized perovskite material to own distinct nonlinear optical property, which can be applied into nonlinear optical devices. Therefore, the organic-inorganic hybridized perovskite quantum dot material owns a vital position in the field of the hybridized perovskite material.

Currently, the preparation method of the organic-inorganic hybridized perovskite quantum dot is less to be reported. The hybridized perovskite quantum dot was manufactured by template method before. In 2012, Akihiro Kojima et al. reported using porous alumina template to synthesize nanostructure $CH_3NH_3PbBr_3$ in Chemistry Letters. The method is injecting a precursor solution into nano-scale pores of the porous alumina template, the growth of $CH_3NH_3PbBr_3$ particles are restricted by use of the nano-scale pores to obtain $CH_3NH_3PbBr_3$ quantum dot with luminescence wavelength at 523 nm. Even though using the method can make $CH_3NH_3PbBr_3$ quantum dot, the $CH_3NH_3PbBr_3$ quantum dot is embedded in the aluminum oxide template and not suitable for future processing and application to devices. In 2014, Luciana C. Schmidt first reported using non-template method to make nanostructure $CH_3NH_3PbBr_3$ on the Journal of American Chemistry Society. The method is using ODE (1-octadecene) as the solution, under the reaction temperature 80° C. adding methyl ammonium bromide salts, long-chain amine bromide salts, lead bromide etc, dispersing the above-mentioned materials into the solution uniformly, finally adding acetone thereto, then the $CH_3NH_3PbBr_3$ particles are obtained via precipitation method. If the $CH_3NH_3PbBr_3$ particles with luminescence wavelength at 526 nm, the fluorescence quantum yield reaches to 20%. However, the hybridized perovskite quantum dot material still has a low fluorescence quantum yield. The dispersibility of quantum dot in solutions still needs to be improved. Nowadays, reports on the hybridized perovskite quantum dot material still focus on $CH_3NH_3PbBr_3$ quantum dot with luminescence wavelengths in the range of 520-530 nm, the adjustment of the luminescence wavelength is very narrow.

Therefore, even though the perovskite quantum dot material exhibits the photoluminescence property and excellent optoelectronic property at the room temperature, the perovskite quantum dot material still has a low quantum yield. It is difficult for the perovskite quantum dot material to disperse into solutions, meanwhile to prevent the structure from damage, which becomes one bottleneck that limits the development of the perovskite quantum dot material. Accordingly, improving the fluorescence quantum yield of the perovskite quantum dot material and obtaining good dispersibility of perovskite solutions seem especially important.

SUMMARY

The present invention aims to solve at least one of the technical problems in the prior art.

In one aspect of the present invention, it discloses a hybridized perovskite quantum dot material. According to an embodiment of the present invention, the quantum dot material includes: a kernel, formed by $R_1NH_3AB_3$ or $(R_2NH_3)_2AB_4$, in which, $R_1$ is a methyl group, $R_2$ is an organic molecular group, A is one or more selected from a group consisting of Ge, Sn, Pb, Sb, Bi, Cu and Mn, B is one or more selected from a group consisting of Cl, Br and I. A and B form a coordination octahedral structure, and $R_1NH_3$ or $R_2NH_3$ is filled in gaps of the coordination octahedral structure; a surface ligand being an organic acid or organic amine. Therefore, the perovskite quantum dot material of the present invention may have a reasonable structure, to own more excellent properties.

According to an embodiment of the present invention, in the quantum dot material, the ligands are divergent, wrapping out of the surface of the kernel, thus can restrict the growth of the kernel in three-dimensions to keep the size of the quantum dot material in nano-scale.

According to an embodiment of the present invention, in the quantum dot material, $R_2$ is a long-chain organic molecular group. Therefore, the present invention can disclose organic hybridized groups to the quantum dot material, so as to improve the structure of a quantum well of the quantum dot, and to improve the properties of the quantum dot material.

According to an embodiment of the present invention, in the quantum dot material, the surface ligand is an organic acid or a long-chain organic amine which can adsorb the surface of the kernel via Van Der Waals Force, thus to achieve the purpose of restricting the size of the quantum dot material.

According to an embodiment of the present invention, in the quantum dot material, the organic acid includes a saturated or an unsaturated alkyl acid with at least three carbon atoms. So the growth of the kernel in three dimensions can be restricted to keep the size of the quantum dot material in nano-scale, by use of the organic acid wrapping out of the surface of the kernel of the quantum dot material.

According to an embodiment of the present invention, in the quantum dot material, the molecular formula of the long-chain organic amine is $RNH_2$ in which R is a saturated linear or branched alkyl group, or an unsaturated linear or a branched alkyl group. Therefore, it is possible to restrict the growth of the kernel in three dimensions so as to keep the size of the quantum dot material in nano-scale, by use of the long-chain organic amine wrapping out of the surface of the kernel of the quantum dot material.

According to an embodiment of the present invention, in the quantum dot material. the long-chain organic amine is an alkyl or aryl amine with from 4 to 24 carbon atoms, to restrict the growth of the kernel in three dimensions while to ensure that the stability of the quantum dot material will not be affected, thereby to improve the properties of the quantum dot material.

One aim of the present invention is to disclose a hybridized perovskite quantum dot material that has a high fluorescence quantum yield. It is suitable for a variety of hybridized perovskite quantum dots and luminescence wavelengths can cover the entire visible region. The hybridized perovskite quantum dot material that has a high fluorescence quantum yield includes: a kernel which is formed by $R_1NH_3AB_3$ or $(R_2NH_3)_2AB_4$, where A and B form a coordination octahedral structure, $R_1NH_3$ or $R_2NH_3$ is filled in gaps of the coordination octahedral structure, $R_1$ is methyl, $R_2$ is a long-chain organic molecular group, A is one or more selected from a group consisting of Ge. Sn, Pb, Sb, Bi, Cu and Mn, and B is one or more selected from a group consisting of Cl, Br and I; and surface ligands that are divergent, wrapping out of the surface of the kernel, and the surface ligand is an organic acid or a long-chain organic amine. In this hybridized perovskite quantum dot material, the organic acid is a saturated alkyl acid that its formula is $C_nH_{2n+1}COOH$ (n≥2), or an unsaturated alkyl acid that its formula is $CH_{2n-1}COOH$ (n≥2). In above-mentioned hybridized perovskite quantum dot material, a molecular formula of the long-chain organic amine is $RNH_2$, in which R is a saturated linear or a branched alkyl group, or an unsaturated linear or a branched alkyl group.

In another aspect of the present invention, it discloses a method for making a hybridized perovskite quantum dot material. According to an embodiment of the present invention, the method includes following steps: (1) dissolving an inorganic metal halide and an organic ammonium halide in a first solvent to obtain a precursor solution, in which both the inorganic metal halide and the organic ammonium halide exist in the form of free molecules; and (2) dropping the precursor solution into a second solvent dropwise, in which, the solubility of the inorganic metal halide and the organic ammonium halide in the first solvent is different from that in the second solvent to allow the inorganic metal halide and the organic ammonium halide to be self-assembled, so that an inorganic metal cation of the inorganic metal halide and halogen anions of the organic ammonium halide form a coordination octahedral structure, and organic ammonium cations of the organic ammonium halide enter into gaps of the coordination octahedral structure to obtain the hybridized perovskite quantum dot material, of which, a surface ligand has been added in advance to one or more selected from a group consisting of the first solvent and the second solvent, and the surface ligand is an organic acid or a long-chain organic amine. In that case, it is possible to simply make the hybridized perovskite quantum dot material, while allow it to have a relatively high fluorescence quantum yield.

According to an embodiment of the present invention, the first solvent includes one or more selected from a group consisting of N,N-dimethyl formamide, dimethyl sulfoxide, tetrahydrofuran, acetonitrile, N-methyl pyrrolidinone and acetone. The second solvent includes one or more selected from a group consisting of toluene, chloroform, n-hexane, cyclohexane, ethyl acetate, and diethyl ether. Therefore, it is possible to make the solubility of the inorganic metal halide and the organic ammonium halide in the first solvent different from that in the second solvent, thus promoting self-assembly of the inorganic metal halide and the organic ammonium halide, thus simply making the hybridized perovskite quantum dot material and allowing the quantum dot material to have a relatively high fluorescence quantum yield.

According to an embodiment of the present invention, the first solvent and the second solvent are miscible. Thus, it is possible to fulfill the self-assembly of the inorganic metal halide and the organic ammonium halide so as to improve the efficiency and effect of making the quantum dot material by this method, by easily adding the precursor solution containing the first solvent to the second solvent.

According to an embodiment of the present invention, the organic acid includes a saturated or an unsaturated alkyl acid with at least three carbon atoms; and a molecular formula of the long chain organic amine is $RNH_2$ in which R is a saturated linear or branched alkyl group, or an unsaturated linear or a branched alkyl group. Therefore, it is possible to select an organic amine with an appropriate structure as the long-chain organic amine surface ligand according to different inorganic metal halides, so as to simply make the hybridized perovskite quantum dot material while allow the quantum dot material to have a relatively high fluorescence quantum yield.

According to an embodiment of the present invention, the long chain in the long-chain organic amine is an alkyl or aryl group with from 4 to 24 carbon atoms. Therefore, it is possible to select an organic amine with an appropriate structure as the long-chain organic amine surface ligand according to different inorganic metal halides, so as to simply make the hybridized perovskite quantum dot material while allow the quantum dot material to have a relatively high fluorescence quantum yield.

According to an embodiment of the present invention, the precursor solution may be obtained by following steps: (a) mixing the inorganic metal halide and the organic ammonium halide in which a molar ratio is 1:(0.1~3), and adding the long-chain organic amine, the molar ratio of the long-chain organic amine to the inorganic metal halide is (0.1~3):1; in which, the inorganic metal halide is one or more selected from a group consisting of halides of Ge, Sn, Pb. Sb, Bi. Cu and Mn, and the halide includes one or more selected from a group consisting of chloride, bromide and iodide; (b) adding the organic acid to the mixed solution obtained in step (a), the molar ratio of the organic acid to the inorganic metal halide is (0~20): 1, and adding the first solvent; the a molar ratio of the first solvent to the inorganic metal halide is (20~1000): 1; and (c) performing ultrasonic treatment to mixed solution obtained in step (b), then filtering the ultrasound-treated mixed solution with a 0.2 µm-pore size polytetrafluoroethylene (referred to as PTFE) filter head, and retaining the filtrate to obtain the precursor solution. In this case, it is possible to simply make the precursor solution so as to improve the preparation efficiency of the method.

According to an embodiment of the present invention, the organic ammonium halide is obtained by the following steps: dissolving an organic amine in absolute ethanol to prepare a solution in which the volume of the organic amine accounts for 40%, and stirring well, in an ice water bath environment, adding a haloid acid to the solution while stirring, the molar ratio of the organic amine to the haloid acid is 1:(1~3), and continuously stirring for 2 hours in the ice water bath environment, then evaporating the solution with a rotary evaporator at 50 centigrade under a pressure of −0.1 MPa to remove the solvent and obtain powders of the organic ammonium halide, then washing the powders of the organic ammonium halide three times with diethyl ether, filtering then obtaining a residue, and drying the residue in a vacuum drying oven at 50 centigrade under a pressure of −0.1 MPa for 4 hours to obtain the organic ammonium halide. In which, the haloid acid includes one or more selected from a group consisting of HCl, HBr and HI, and the organic amine is a saturated alkyl amine that its formula is $C_nH_{2n-1}NH_2$ (n≥1) and an unsaturated alkyl or an aryl amine that its formula is $CH_{2n-1}NH_2$ (n≥2).

According to an embodiment, step (2) further includes: (2-1) dropping the precursor solution into the second solvent, dropwise, at an adding speed 10 µL to 1 mL per minute while stirring, a volume ratio of the added precursor solution to the second solvent is 1:(0.0001~10), and continuously stirring for 2 hours to obtain a suspension solution; (2-2) centrifuging the suspension solution with a centrifuge at a rotational speed of 7500 rpm for 4 minutes to obtain supernatant containing the hybridized perovskite quantum dot material; and (2-3) distilling the supernatant to dryness and then drying the remaining solid at 70 centigrade under a pressure −0.1 MPa for 8 hours to obtain the hybridized perovskite quantum dot material. Therefore, it is possible to allow the inorganic metal halide and the organic ammonium halide to be self-assembled thus simply obtain the hybridized perovskite quantum dot material by adding the second solvent.

The principle of the method of the present invention for making the hybridized perovskite quantum dot material is: both the inorganic metal halide and the organic ammonium halide are soluble in the first solvent, and they exist therein in the form of free molecules. When the precursor solution is dropped into the second solvent, they will soon be self-assembled: an inorganic metal cation and halogen anions will form a coordination octahedral structure, and organic ammonium cations will enter into gaps of the coordination octahedral structure to form a hybridized perovskite structure; meanwhile, due to the existence of oleic acid, long-chain organic amine and some other ligands in the solution, these ligands will wrap out of surfaces of the formed particles and restrict the growth of the particles in three dimensions, thereby limiting the size of the particles in nano-scale, and finally resulting in the formation of the hybridized perovskite quantum dots. In the preparation method of the present invention, it is possible to make hybridized perovskite quantum dots with different luminescence wavelengths by adjusting the ratio of the inorganic halide to the long-chain organic amines; it is possible to make the hybridized perovskite quantum dots having different components by adjusting variety and ratio of the first solvent to the second solvent. In the preparation method of the present invention, the surface ligands may be added to the first solvent or to the second solvent; the organic-inorganic hybridized perovskite fluorescence quantum dot made via the method of the present invention, is wrapped with organic ligands out of its surface, may be stably dispersed in the second solvent, which facilitates the processing and application of the hybridized perovskite quantum dot, and the hybridized perovskite quantum dot material can be obtained by removal of organic solvents through distillation.

In another aspect of the present invention, it provides a method for making the hybridized perovskite quantum dot material as described earlier. According to an embodiment of the present invention, the method includes: (1) dissolving an organic amine in absolute ethanol to prepare a solution that the volume of the organic amine accounts for 40%, and stirring for 10 minutes until homogeneous: in an ice water bath environment, adding the haloid acid to the solution, a molar ratio of the organic amine to the haloid acid is 1:(1~3) while stirring, and continuously stirring for 2 hours in the ice water bath environment to obtain a clear solution; evaporating the solution with a rotary evaporator at 50 centigrade under a pressure −0.1 MPa to remove the solvent and obtain crystalline powder of the organic ammonium halide; washing the crystalline powder three times with diethyl ether, filtering, and drying in a vacuum drying oven at 50 centigrade under a pressure −0.1 MPa for 4 hours to obtain powder of the organic ammonium halide, wherein the organic amine is a saturated alkyl amine that its formula is $C_nH_{2n-1}NH_2$ (n≥1) or an unsaturated alkyl or aryl amine that its formula is $C_nH_{2n-1}NH_2$ (n≥2); (2) mixing the inorganic metal halide and the organic ammonium halide powder that a molar ratio of the inorganic metal halide to the organic ammonium halide power is 1:(0.1~3), adding a long-chain organic amine as described above where a molar ratio of the long-chain organic amine to the inorganic metal halide is 1:(0.1~3), then adding an organic acid as described above where a molar ratio of the organic acid to the inorganic metal halide is 1:(0~20), and then adding a first solvent that a molar ratio of the first solvent to the inorganic metal halide is 1:(20~1000); after mixing, performing ultrasonic treatment to the mixture for 5 minutes to obtain a transparent mixed solution, and filtering the transparent mixed solution with 0.2 μm-pore size PTFE filter head to obtain filtrate as a precursor solution; in this step, the inorganic metal halide is one and only one selected from a group consisting of halides of Ge, Sn, Pb, Sb, Bi, Cu and Mn, and the first solvent is one and only one selected from a group consisting of N,N-dimethyl formamide, dimethyl sulfoxide, tetrahydrofuran, acetonitrile, and acetone; (3) placing a second solvent on a magnetic mixer to be fast stirred, dropping the precursor solution into the second solvent via a microsyringe at an adding speed 10 μL to 1 mL per minute, dropwise while stirring, where the volume ratio of the precursor solution to the second solvent is 1:(0.0001~10), and continuously stirring for 2 hours to obtain a suspension of organic-inorganic hybridized perovskite material, of which the second solvent is one and only one selected from a group consisting of toluene, chloroform, n-hexane, cyclohexane, ethyl acetate, and diethyl ether, selectively, the first solvent and the second solvent are miscible; (4) centrifuging the suspension of organic-inorganic hybridized perovskite material obtained in step (3) with a centrifuge at a rotational speed 7500 rpm for 4 minutes to obtain precipitate which is hybridized perovskite nanosheets or nanorods and supernatant which is a hybridized perovskite quantum dot solution; (5) distilling the hybridized perovskite quantum dot solution obtained in step (4) to remove the organic solvents, and drying the remaining solid in a vacuum drying oven at 70 centigrade under a pressure −0.1 MPa for 8 hours to obtain the hybridized perovskite quantum dot material. Therefore, it is possible to simply make the hybridized perovskite quantum dot material and thus to improve the efficiency of making the quantum dot material.

In another aspect of the present invention, it discloses a hybridized perovskite quantum dot material which is made according to the method of the present invention described above. Therefore, the quantum dot has all properties and advantages of the quantum dot made using the above-described method, which will not be described in detail here.

In another aspect of the present invention, it discloses a method for making the above-mentioned hybridized perovskite quantum dot material. According to an embodiment of the present invention, the method includes: (1) dissolving an inorganic metal halide and an organic ammonium halide or a halide of cesium in a first solvent to obtain a precursor solution, in which the inorganic metal halide, the organic ammonium halide or the halide of cesium exist in a dispersed form; (2) adding the precursor solution to a second solvent to form an emulsion system, where a surface ligand has been added in advance to one or more selected from a group consisting of the first solvent and the second solvent and the surface ligand is an organic acid or a long-chain organic amine; and the first solvent and the second are immiscible, the emulsion system contains micelles formed by the surface ligand, the precursor solution is encapsulated in the micelles, and the micelles are dispersed in the second solvent; and (3) adding a demulsifier to the emulsion system so that the precursor solution in the micelles is diffused into the second solvent, enabling the inorganic metal halide, and the organic ammonium halide or halide of cesium to be self-assembled; an inorganic metal cation of the inorganic metal halide, and the halogen anions of the organic ammonium halide or halide of cesium form a coordination octahedral structure; and organic ammonium cations of the organic ammonium halide enter into gaps of the coordination octahedral structure to form the perovskite quantum dot material, of which the inorganic metal halide is one or more selected from a group consisting of halides of Ge, Sn, Pb, Sb, Bi, Cu and Mn, the halide includes one or more selected from a group consisting of chloride, bromide and iodide, the first solvent is one or more selected from a group consisting of N,N-dimethyl formamide, acetonitrile, N-methyl pyrrolidinone and dimethyl sulfoxide, the second solvent is one or more selected from a group consisting of 1-octadecene, n-hexane, cyclohexane and n-heptane, and a surface ligand has been added in advance to one or more selected from a group consisting of the first solvent and the second solvent, and the surface ligand is an organic acid or a long-chain organic amine.

According to an embodiment of the present invention, in this method, the organic acid includes a saturated or unsaturated alkyl acid with at least three carbon atoms, and the molecular formula of the long-chain organic amine is $RNH_2$ in which R is a saturated linear or a branched alkyl group, or an unsaturated linear or a branched alkyl group. Therefore, it is possible to use the above-mentioned organic acids as the surface ligands and thus to improve the properties of the quantum dot material prepared.

According to an embodiment of the present invention, in this method, the long-chain organic amine is an alkyl or aryl amine with from 4 to 24 carbon atoms. Therefore, it is possible to use the above-mentioned organic acids as the surface ligands and thus to improve the properties of the quantum dot material prepared.

According to an embodiment of the present invention, the precursor solution is obtained by the following steps: mixing the inorganic metal halide that the molar ratio of the organic ammonium halide to the halide of cesium is 1:(0.1~3), adding the long-chain organic amine that the ratio of the long-chain organic amine to the inorganic metal halide is (0.1~3): 1, adding the organic acid that the molar ratio of the organic acid to the inorganic metal halide is (0~20): 1, adding the first solvent that the molar ratio of the first solvent to the inorganic metal halide is (20~1000) to 1 to form a mixed solution, and performing ultrasonic treatment to the mixed solution, then filtering with a 0.2 μm-pore size PTFE filter head, retaining filtrate to obtain the precursor solution.

In this case, it is possible to obtain a precursor solution and thus simply obtain a perovskite quantum dot material in subsequent steps.

According to an embodiment of the present invention, the organic ammonium halide is obtained by the following steps: dissolving an organic amine in absolute ethanol to prepare a solution which the volume of the organic amine accounts for 40%, and stirring well; in the ice water bath environment, adding a haloid acid to the solution where the molar ratio of the organic amine to the haloid acid is 1:(1~3) while stirring, and continuously stirring for 2 hours in the ice water bath environment; evaporating the solution with a rotary evaporator at 50 centigrade under a pressure −0.1 MPa to remove the solvent and obtain powder of the organic ammonium halide; washing the organic ammonium halide powder three times with diethyl ether, filtering to obtain a residue and drying the residue in a vacuum drying oven at 50 centigrade under a pressure −0.1 MPa for 4 hours to obtain the organic ammonium halide, in which the haloid acid includes one or more selected from a group consisting of HCl, HBr and HI, and the organic amine is one or more selected from a group consisting of methylamine, formamide, and acetamine. Therefore, it is possible to simply obtain the organic ammonium halide and thus to improve the efficiency and effect of making the perovskite quantum dot material using this method.

According to an embodiment of the present invention, step (2) further includes: dropping the precursor solution into the second solvent, dropwise at an adding speed 10 μL to 1 mL per minute while stirring, where the volume ratio of the added precursor solution to the second solvent is 1:(0.0001~10), and continuously stirring for 2 hours to obtain the emulsion system. Therefore, it is possible to obtain an emulsion system and thus to improve the efficiency and effect of preparing the perovskite quantum dot material using this method.

According to an embodiment of the present invention, step (3) further includes: adding a demulsifier to the emulsion system where the volume ratio of the demulsifier to the second solvent is 1:(1~10), centrifuging the obtained emulsion system with a centrifuge at a rotational speed 7500 rpm for 4 minutes to obtain supernatant so as to obtain a hybridized perovskite quantum dot solution, washing the hybridized perovskite quantum dot solution and drying under vacuum to obtain the perovskite quantum dot material, of which, the demulsifier is one or more selected from a group consisting of acetone, methanol, isopropanol, n-butanol and tert-butanol. Therefore, it is possible to obtain the hybridized perovskite quantum dot material simply by the self-assembly process and adding the demulsifier, and thus to improve the efficiency and effect of preparing the perovskite quantum dot material using this method.

In another aspect of the present invention, it discloses a semiconductor device. According to an embodiment of the present invention, the device includes the aforementioned hybridized perovskite quantum dot material. Therefore, the quantum dot material can provide quantum dots with a reasonable structure and good properties to the semiconductor device, and thus to improve effect of use of the semiconductor device.

According to an embodiment of the present invention, the semiconductor device includes electroluminescent devices, solar batteries, display devices and non-linear optical devices. Therefore, the quantum dot material according to embodiments of the present invention can be applied to corresponding positions of the devices, performing corresponding functions thus improving effect of use of the devices.

Figure 1:
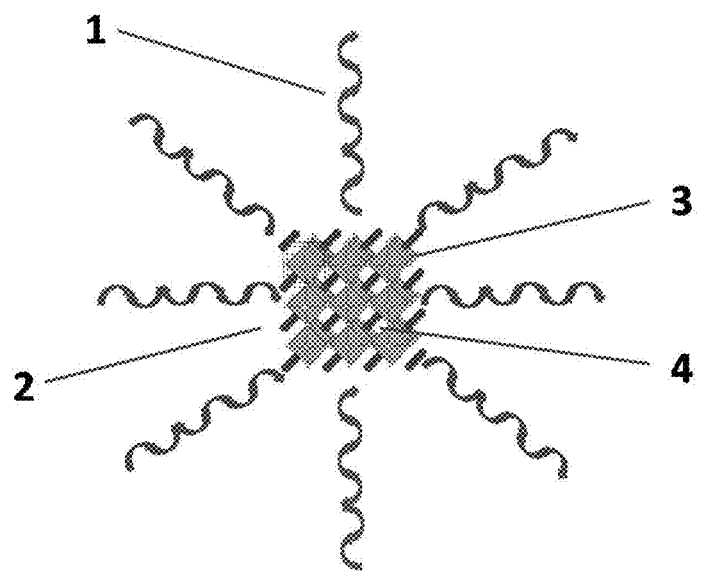
FIG. 1 is a structural schematic diagram of a hybridized perovskite quantum dot material according to one embodiment of the present invention.

DESCRIPTION OF REFERENCE SIGNS 1. surface ligand
2. kernel
3. octahedron
4. organic amine
5. Al electrode
6. Hole transport layer
7. quantum dot light-emitting layer
8. Titanium diisopropoxide bis(acetylacetonate) layer
9. Indium tin oxide layer
10. glass substrate

DETAILED DESCRIPTION OF THE EMBODIMENTS

Embodiments of the present invention will be described in detail below, of which examples are illustrated in the drawings, throughout which identical or similar signs indicate identical or similar elements or elements having identical or similar functions. It should be understood that the specific embodiments described herein are merely used for describing the present invention, but are not intended to limit the present invention.

In one aspect of the present invention, it provides a hybridized perovskite quantum dot material. According to an embodiment of the present invention, referring to FIG. 2, the quantum dot material includes surface ligands 1 and a kernel 2. Specifically, according to an embodiment of the present invention, the kernel 2 is formed by $R_1NH_3AB_3$ or $(R_2NH_3)_2AB_4$, in which A is a central metal cation and B is a halogen anion. The central metal cations A and the halogen anions B form a regular octahedron 3, and an organic amine 4, i.e., $R_1NH_3$ or $R_2NH_3$, is filled in gaps of the octahedron 3. Furthermore, the surface ligands 1 are adsorbed on a surface of the kernel 2 via Van Der Waal forces. In this way, each octahedron 3 in the kernel 2 is connected and extended via common vertexes, and the organic amine 4 enters into gaps of the regular octahedron 3 by means of hydrogen bonds formed by hydrogens at the organic amine and the halogen anion B, of which organic and inorganic layers are alternately arranged as a hybridized structure, thus has combined advantages of the inorganic and organic material on a molecular scale. Furthermore, the quantum dot material has a relatively high fluorescence quantum yield, thereby improving the photoelectric performance and enlarging range of use of the quantum dot material according to embodiments of the present invention.

According to an embodiment of the present invention, A is one or more selected from a group consisting of Ge, Sn, Pb, Sb, Bi, Cu and Mn, B is one or more selected from a group consisting of Cl, Br and I $R_1$ is methyl, and $R_2$ is a long-chain organic molecular group. Specifically, according to an embodiment of the present invention, $R_2$ is an alkyl or an aryl group with at least two carbon atoms. Therefore, based on actual metal element and halogen for forming the quantum dot material and the size of the gap of the regular octahedron 3 for forming the kernel 2, being able to choose an appropriate organic amine 4 with $R_1$ or $R_2$ groups for filling, thus to increase the stability of the quantum dot material according to the embodiment of the present invention. Furthermore, adjustment of luminescence wavelength of the quantum dot may be realized by selecting components constituting the quantum dot.

According to an embodiment of the present invention, surface ligands 1 is carried on the surface of the kernel 2. According to an embodiment of the present invention, the surface ligands 1 are an organic acid or a long-chain organic amine, and they are divergent, wrapping out of the surface of the kernel 2. Thus, the surface ligands 1 may restrict the growth of the kernel 2 in three dimensions so as to keep the size of the quantum dot material in the nano-scale.

Specifically, the organic acid for forming the surface ligand 1 may be a saturated or unsaturated alkyl acid with at least three carbon atoms. According to some embodiments of the present invention, the organic acid may be a saturated alkyl acid that the formula is $C_nH_{2n+1}COOH$ ($n \geq 2$), or an unsaturated alkyl acid that the formula is $C_nH_{2n-1}COOH$ ($n \geq 2$): the long-chain organic amine that the molecular formula may be $RNH_2$, for forming the surface ligand 1, of which R is a saturated linear or a branched alkyl group, or an unsaturated linear or a branched alkyl group. More specifically, R may be an alkyl or aryl group containing from 4 to 24 carbon atoms. By the aforementioned organic acid or long-chain organic amine forming the surface ligand 1, the size of the quantum dot material can be limited while the stability of the quantum dot material can be ensure, therefore, improving the performance of the quantum dot material.

Furthermore, according to an embodiment of the present invention, the quantum dot material has particles with size of 3 to 4 nm. Furthermore, by means of an integrating sphere instrument for measurement of quantum yield (C9920-02, Hamamatsu Photonics) and according to a method described in the instruction from its manufacturer, inventors tested fluorescence quantum yields of quantum dot materials made according to embodiments 1-13 of the present invention. The quantum dot materials according to the embodiments of the present invention could have fluorescence quantum yields not lower than 60%, which is higher than that of the conventional hybridized perovskite quantum dot material. Moreover, according to an embodiment of the present invention, the quantum dot material can also be stably dispersed in a variety of organic solvents such as toluene, chloroform, n-hexane, cyclohexane and ethyl acetate, and both the powder and solution of the quantum dots have good stability, and the fluorescence remains a long time without quenching. Meanwhile, being able to select different metal elements, halogens and surface ligands, the component and structure of the quantum dot material can be determined accordingly to make quantum dots with different luminescence wavelengths that can cover the entire visible region, which allows the quantum dots to have great advantages when applied to high color gamut white light LEDs. For example, by adjusting ratios of inorganic metal halide to the long-chain organic amine, hybridized perovskite quantum dots having different luminescence wavelengths can be made: and by adjusting variety and ratio of the first solvent to the second solvent, hybridized perovskite quantum dots having different components can be made. Further, the quantum dot material according to an embodiment of the present invention has a relatively narrow half-peak width while emits high color-purity light, can meet requirements in actual application, and owns a wide application prospect in fields of high-performance display devices, laser, non-linear optics, etc.

Figure 11:
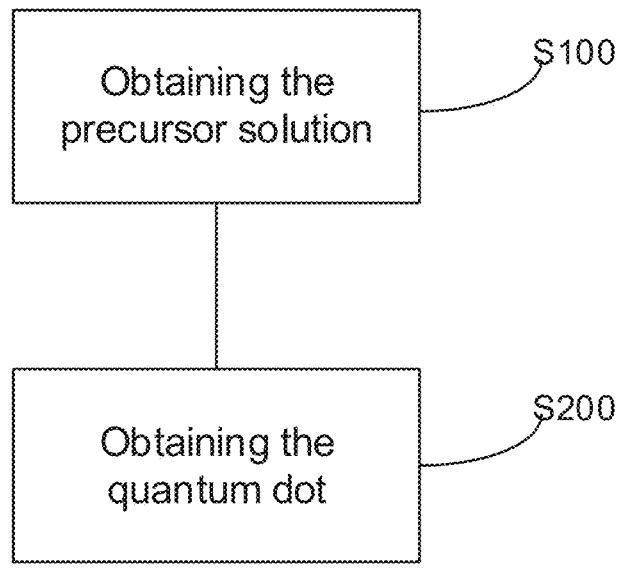
FIG. 11 is a flow chart of a method for making a hybridized perovskite quantum dot material according to one embodiment of the present invention.

In another aspect of the present invention, it provides a method for making a hybridized perovskite quantum dot material. According to an embodiment of the present invention, referring to FIG. 11, the method includes:

S100: Obtaining a Precursor Solution

According to an embodiment of the present invention, in this step, an inorganic metal halide and an organic ammonium halide are dissolved in a first solvent to obtain a precursor solution. Specifically, according to embodiments of the present invention, the first solvent includes one or more selected from a group consisting of N,N-dimethyl formamide, dimethyl sulfoxide, tetrahydrofuran, acetonitrile, N-methyl pyrrolidinone and acetone. Both the inorganic metal halide and the organic ammonium halide exist in the first solvent in a dispersed form. It shall be noted that in the present invention, the expression "dispersed form" particularly means that both the inorganic metal halide and the organic ammonium halide are dispersed in the solution in free states, with no coordination reaction occurring therebetween to result in formation of any crystal or compound. Therefore, being able to select an appropriate first solvent so that the inorganic metal halide and organic ammonium halide are dissolved in the first solvent without coordination reaction occurring between the metal cation and halogen anion, thereby obtaining a precursor solution where both the inorganic metal halide and the organic ammonium halide are free and dispersive in the precursor solution.

Figure 12:
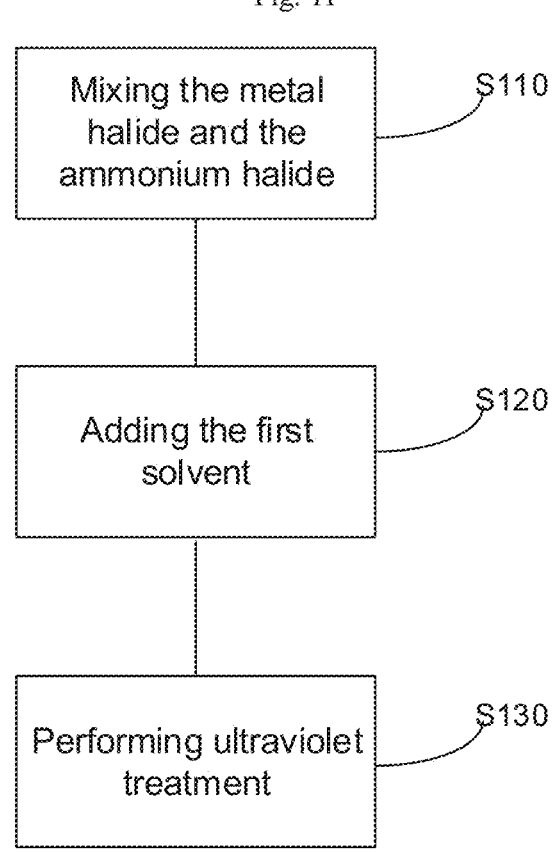
FIG. 12 is a flow chart of a method for making a hybridized perovskite quantum dot material according to another embodiment of the present invention.

Further, according to an embodiment of the present invention, referring to FIG. 12, the precursor solution may be obtained by the following steps:

S110: Mixing Metal Halide and Organic Ammonium Halide

According to an embodiment of the present invention, in this step, one metal selected from Ge. Sn, Pb, Sb, Bi, Cu and Mn and one halogen of chlorine, bromine and iodine form a metal halide, and the metal halide is mixed with an organic ammonium halide where the molar ratio of the metal halide to the organic ammonium halide is 1:(0.1~3). Then, a long-chain organic amine is added as the surface ligand to the mixture of the metal halide and the organic ammonium halide, of which the molar ratio of the long-chain organic amine to the inorganic metal halide is 1:(0.1~3). According to an embodiment of the present invention, the molecular formula of the long-chain organic amine may be $RNH_2$ in which R is a saturated linear or a branched alkyl group or an unsaturated linear or a branched alkyl group. Selectively, according to an embodiment of the present invention, R may be an alkyl or aryl group containing from 4 to 24 carbon atoms.

According to an embodiment of the present invention, the organic ammonium halide is made as follows: dissolving an organic amine in absolute ethanol to obtain a solution of which the volume of the organic amine accounts for 40%, and after stirring well, adding a haloid acid to the solution in an ice water bath environment while stirring, the haloid acid includes one or more selected from a group consisting of HCl, HBr and HI, and the organic amine is a saturated alkyl amine that the formula is $C_nH_{2n+1}NH_2$ (n≥1) and an unsaturated alkyl or aryl amine that its formula is $C_nH_{2n-1}NH_2$ (n≥2). According to an embodiment of the present invention, the molar ratio of the organic amine to the haloid acid is 1:(1~3). Specifically, according to an embodiment of the present invention, a mixture of the organic amine and the haloid acid may be continuously stirred for 2 hours in the ice water bath environment, and then evaporated with a rotary evaporator at 50 centigrade under a pressure −0.1 MPa to remove the solvent, and the remaining powder may be washed three times with diethyl ether, and filtered to obtain a residue, and the residue may be dried in a vacuum drying oven at 50 centigrade in the pressure of −0.1 MPa for 4 hours to obtain the organic ammonium halide.

S120: Adding a First Solvent

According to one embodiment of the present invention, in this step, an organic acid is first added as the surface ligand to the mixture of the inorganic metal halide and the organic ammonium halide containing the long-chain organic amine ligand, of which the molar ratio of the organic acid added to the inorganic metal halide is 0~20:1, so as to obtain a mixture solution containing the organic acid ligand. The organic acid surface ligand may be a saturated or an unsaturated alkyl acid with at least 3 carbon atoms. Specifically, according to one embodiment of the present invention, the organic acid may be a saturated alkyl acid that its a formula is $C_nH_{2n+1}COOH$ (n≥2), or an unsaturated alkyl acid that its a formula is $C_nH_{2n-1}COOH$ (n≥2). Then, a first solvent is added to the mixture solution where the molar ratio of the first solvent to the inorganic metal halide is (20~1000):1.

According to another embodiment of the present invention, in this step, the molar ratio of the organic acid added to the inorganic metal halide may also be 1:(0~20), and the molar ratio of the first solvent added to the inorganic metal halide may also be 1:(20~1000). Thus, it is possible to prepare quantum dot materials having different components and thus expand the type of the quantum dot material prepared using this method, by adjusting the above-mentioned ratios.

S130: Ultrasound

According to an embodiment of the present invention, in this step, performing ultrasonic treatment to the mixture solution after adding the first solvent to it, then filtering via a 0.2 μm-pore size PTFE filter head, retaining filtrate to obtain the precursor solution.

S200: Obtaining Quantum Dot

According to an embodiment of the present invention, in this step, the precursor solution is dropped into a second solvent, dropwise so that the inorganic metal halide and the organic ammonium halide in the precursor solution are self-assembled to obtain a hybridized perovskite quantum dot material. Specifically, the second solvent includes one or more selected from a group consisting of toluene, chloroform, n-hexane, cyclohexane, ethyl acetate and diethyl ether. Selectively, according to some embodiments of the present invention, the second solvent and the first solvent are miscible. That means, being able to select a solvent that can be miscible with the first solvent as the second solvent to complete the preparation process of the quantum dot material. It shall be noted that, in the present invention, the term "miscible" particularly means when the first solvent and the second solvent are mixed, no separation of layers occur in the mixed solution. Thus, it is possible to select an appropriate organic matter from the above as the second solvent so that the solubility of the inorganic metal halide and the organic ammonium halide in the first solvent is different from that in the second solvent, thereby allowing the inorganic metal cation of the inorganic metal halide and halogen anions of the organic ammonium halide to form a coordination octahedral structure, allowing the organic ammonium cations of the organic ammonium halide to enter into gaps of the coordinated octahedral structure simultaneously. A hybridized perovskite quantum dot material having a relatively high fluorescence quantum yield and adjustable photoelectric properties may be made without using a template, therefore simplifying the process of making the quantum dot material.

Figure 13:
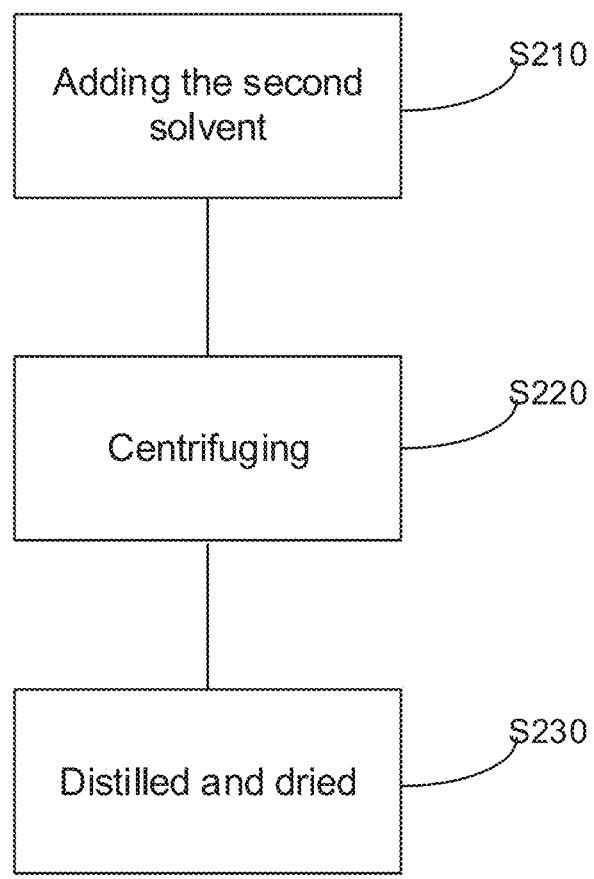
FIG. 13 is a flow chart of a method for making a hybridized perovskite quantum dot material according to another embodiment of the present invention.

According to an embodiment of the present invention, referring to FIG. 13, after the precursor solution is prepared, the quantum dot material can be further obtained by the following steps:

S201: Adding the Second Solvent

According to an embodiment of the present invention, the precursor solution is added to the second solvent. Specifically, the precursor solution is dropped into the second solvent at an adding speed of 10 μL to 1 mL per minute, dropwise while stirring. In this step, the volume ratio of the added precursor solution to the second solvent is 1:(0.0001~10). After finishing the dropping, the stirring is continuously performed for 2 hours to produce a suspension. Thus, the precursor solution to the second solvent is added slowly to ensure that the coordination reaction of the inorganic metal cation of the inorganic metal halide and the halogen anion of the organic ammonium halide is slow, so as to form a complete octahedral structure by self-assembly.

S220: Centrifuging

In this step, the solution obtained above is centrifuged. Specifically, according to an embodiment of the present invention, the centrifuging process may be performed with a centrifuge at a rotational speed of 7500 rpm for 4 minutes. After the centrifuging, the hybridized perovskite quantum dot material is distributed in supernatant. Furthermore, inventors find that the precipitate after the centrifuging is hybridized perovskite nanosheets or nanorods. Thus, the solution containing the quantum dot material may be simply separated from the other by-products, thereby decreasing the amount of impurities in the quantum dot material made by this method.

S230: Distillation and Drying

In this step, the above supernatant was distilled and dried to obtain the quantum dot material according to an embodiment of the present invention. Specifically, according to an embodiment of the present invention, the supernatant is distilled, and after no liquid solvent is existed, the remaining solid is dried for 8 hours at 70 centigrade under a pressure of −0.1 MPa to obtain the hybridized perovskite quantum dot material. In this manner, a high purity quantum dot material can be simply obtained. Meanwhile, based on the method according to an embodiment of the present invention, the powdered quantum dot material can be obtained by drying process, while maintaining the quantum dot material is stably existing without agglomeration.

Overall, in the second aspect of the present invention, the principle of making the hybridized perovskite quantum dot material disclosed in the present invention is: both the inorganic metal halide and the organic ammonium halide are soluble in the first solvent, and they exist therein in a dispersed form to form a precursor solution. When the precursor solution is dropped into the second solvent, dropwise, since the solubility of the organic ammonium halide and the inorganic metal halide in the first solvent is different from that in the second solvent, they will be fast self-assembled, an inorganic metal cation and halogen anions will form a coordination octahedral structure, and organic ammonium cations will enter into gaps of the coordination octahedral structure to form a hybridized perovskite structure; meanwhile, due to the existence of the ligands such as organic acids, long-chain organic amines in the solution, these ligands will be wrapping out of the surface of the formed regular octahedral particles to restrict the growth of the particles in three dimensions so as to keep the size of the particles in nano-scale, and finally forming the hybridized perovskite quantum dots.

In the preparation method of the present invention, the hybridized perovskite quantum dots having different luminescence wavelengths can be made by adjusting amount ratio of the inorganic metal halide to the long-chain organic amine; the hybridized perovskite quantum dots having different components can be made by adjusting variety and ratio of the first solvent to the second solvent: according to the preparation method of the present invention, the surface ligand may be added to the first solvent or to the second solvent: the organic ligands are carried on the surface of the hybridized perovskite fluorescence quantum dot and can be stably dispersed in the second solvent, which facilitates the processing and application of the hybridized perovskite fluorescence quantum dot, and the hybridized perovskite quantum dot material may be obtained by removal of the organic solvents through distillation.

Therefore, the organic-inorganic hybridized perovskite fluorescence quantum dot material made by the aforementioned method has the following advantages:

1. The method provided in this invention for making the hybridized perovskite quantum dot material requires no template and no heating treatment, own a rapid reaction, low cost and simple operations, and can get hybridized perovskite quantum dot powder and solutions of quantum dots dispersed in various organic solvents simultaneously.

2. The method can produce hybridized perovskite quantum dots having an ultra-small particle size, and the quantum dot exhibits high luminescence intensity and its fluorescence quantum yield may be up to 60%, which is much higher than that of the same kind material obtained using the conventional method.

3. The hybridized perovskite quantum dot material made by the method provided in the present invention can be stably dispersed in a variety of organic solvents such as toluene, chloroform, n-hexane, cyclohexane and ethyl acetate, and both the quantum dot powder and solution having good stability and fluorescence remains a long time without quenching, which sets up a good foundation for the application of the hybridized perovskite quantum dot material.

4. The method is universal and can be applied to make a variety of hybridized perovskite quantum dots, and by determining components and structure of the hybridized perovskite material, quantum dots with different luminescence wavelengths, which can cover the entire visible region, and have great advantages when applied to high color gamut white light LEDs.

5. By whole solution processing the hybridized perovskite quantum dot prepared in the present invention, a trans-electroluminescent device having good performance can be obtained.

6. The hybridized perovskite quantum dot made in the present invention has a narrow half-peak width, emits high luminous purity, can meet requirements in actual application, and owns a wide application prospect in fields of high-performance display devices, laser, non-linear optics, etc.

7. Hybridized perovskite nanosheets or nanorods can be also obtained while obtaining hybridized perovskite quantum dots using the method of the present invention.

In a further aspect of the present invention, it provides a method for preparing the hybridized perovskite quantum dot material as described above in the present invention. According to an embodiment of the present invention, the method includes the following steps:

(1) dissolving an organic amine in absolute ethanol to prepare a solution in which the volume of the organic amine is present accounts for 40%, and stirring for 10 minutes until homogeneous; in an ice water bath environment, adding a haloid acid to the solution where a molar ratio of the organic amine to the haloid acid is 1:(1~3) while stirring, and continuously stirring for 2 hours in the ice water bath environment to obtain a clear solution; evaporating the solution with a rotary evaporator at 50 centigrade under a pressure of −0.1 MPa to remove the solvent and obtain crystalline powder of the organic ammonium halide: washing the crystalline powder three times with diethyl ether, filtering, and drying in a vacuum drying oven at 50 centigrade under a pressure of −0.1 MPa for 4 hours to obtain the powder of the organic ammonium halide. According to an embodiment of the present invention, the organic amine may be a saturated alkyl amine that its formula is $C_nH_{2n+1}NH_2$ ($n \geq 1$) or an unsaturated alkyl or aryl amine that its formula of $C_nH_{2n-1}NH_2$ ($n \geq 2$).

(2) mixing the inorganic metal halide and the organic ammonium halide powder at a molar ratio of 1:(0.1~3), and then adding a long-chain organic amine that the molar ratio of the long-chain organic amine to the inorganic metal halide is 1:(0.1~3). According to an embodiment of the present invention, the molecular formula of the long-chain organic amine may be $RNH_2$, of which R is a saturated linear or a branched alkyl group or an unsaturated linear or a branched alkyl group. Specifically, according to some embodiments of the present invention, the long-chain group in the long-chain organic amine may be an alkyl or aryl group having from 6 to 10 carbon atoms. Thereafter, an organic acid is added where the molar ratio of the organic acid to the inorganic metal halide is 1:(0~20), of which, the organic acid is a saturated or an unsaturated alkyl acid with at least 3 carbon atoms, and according to an embodiment of the present invention, the organic acid may be a saturated alkyl acid that its formula is $C_nH_{2n+1}COOH$ (n≥2), or an unsaturated alkyl acid that the formula is $C_nH_{2n-1}COOH$ (n≥2). Then, a first solvent is added where the molar ratio of the first solvent to the inorganic metal halide is 1:(20~1000) and mixed, performing ultrasonic treatment for 5 minutes to obtain a clear mixed solution that then is filtered with a 0.2 µm-pore size PTFE filter head to retain filtrate as a precursor solution; in this step, the inorganic metal halide is one and only one selected from a group consisting of halides of Ge. Sn, Pb, Sb, Bi, Cu and Mn, the halide includes one or more selected from a group consisting of chloride, bromide and iodide, and the first solvent is one and only one selected from a group consisting of N,N-dimethyl formamide, dimethyl sulfoxide, tetrahydrofuran, acetonitrile and acetone:

(3) placing a second solvent on a magnetic mixer to be fast stirred, dropping the precursor solution via a microsyringe at an adding speed of 10 µL to 1 mL per minute to the second solvent, dropwise whiling stirring, where the volume ratio of the precursor solution to the second solvent is 1:(0.0001~10), and continuously stirring for 2 hours to obtain a suspension of organic-inorganic hybridized perovskite material, of which the second solvent is one and only one selected from a group consisting of toluene, chloroform, n-hexane, cyclohexane, ethyl acetate, and diethyl ether;

(4) centrifuging the suspension of organic-inorganic hybridized perovskite material obtained in step (3) with a centrifuge at a rotational speed of 7500 rpm for 4 minutes to obtain precipitate that is hybridized perovskite nanosheets or nanorods and supernatant that is a hybridized perovskite quantum dot solution;

(5) distilling the hybridized perovskite quantum dot solution obtained in step (4) to remove the organic solvents, and drying the remaining solid in a vacuum drying oven at 70 centigrade under a pressure of −0.1 MPa for 8 hours to obtain the hybridized perovskite quantum dot material.

It is not difficult to see that simply obtaining the aforementioned hybridized perovskite quantum dot material in the present invention using the above method, and the quantum dot material made by this method has aforementioned properties and advantages of the above-mentioned quantum dot material, which will not be repeated here.

In a further aspect of the present invention, it discloses a hybridized perovskite quantum dot material. According to an embodiment of the present invention, the hybridized perovskite quantum dot material is made by the abovementioned method of the present invention. Thus, the hybridized perovskite quantum dot material has all properties and advantages of the hybridized perovskite quantum dot material made by the above-mentioned method.

In another aspect of the present invention, it discloses a method for making perovskite quantum dot material. According to an embodiment of the present invention, the method includes:

(1) dissolving an inorganic metal halide and an organic ammonium halide or a halide of cesium in a first solvent to obtain a precursor solution, of which the inorganic metal halide and the organic ammonium halide or the halide of cesium have good solubility in the first solvent, thus exist therein in a dispersed form.

Specifically, according to an embodiment of the present invention, the inorganic halide and the organic ammonium halide powders or halide of Cs are mixed where the molar ratio of the inorganic halide to the organic ammonium halide powder or the halide of Cs is 1:(0.1~3). Then, a long-chain organic amine is added as the surface ligand where the molar ratio of the long-chain organic amine to the inorganic metal halide is 1:(0.1~3). The molecular formula of the long-chain organic amine is $RNH_2$ of which R represents a saturated linear or a branched alkyl group or an unsaturated linear or a branched alkyl group. Selectively, the R group in the long-chain organic amine may be an alkyl or aryl group having from 4 to 24 carbon atoms. Thereafter, an organic acid is added to the mixture of the inorganic halide mixed with the organic ammonium halide powders or the halide of Cs containing the long-chain organic amine, of which, the organic acid is used as the surface ligand where the molar ratio of the organic acid to the inorganic halide may be (0~100):(1~10). According to an embodiment of the present invention, the organic acid may be a saturated alkyl acid that its formula is $C_nH_{2n+1}COOH$ (n≥2), or an unsaturated alkyl acid that its formula is $C_nH_{2n-1}COOH$ (n≥2). Finally, a first solvent is added to the mixture containing the organic acid and the long-chain organic amine. The molar ratio of the added first solvent to the inorganic halide may be (20~1000): (1~10). After mixing, performing ultrasonic treatment to the mixture for 5 minutes to obtain a transparent solution, subsequently filtering the transparent solution with a 0.2 µm-pore size PTFE filter head, retaining filtrate to obtain the precursor solution. According to an embodiment of the present invention, the inorganic halide in this step is any of halides of Ge, Sn, Pb, Sb, Bi, Cu, and Mn; and the first solvent is one or more selected from a group consisting of N,N-dimethyl formamide, acetonitrile, N-methyl pyrrolidinone and dimethyl sulfoxide.

According to an embodiment of the present invention, the organic ammonium halide added in this step is made by the following steps: dissolving an organic amine in absolute ethanol and mixing them well by stirring to produce a solution, of which the volume of the organic amine accounts for 40%, the organic amine is one and only one selected from a group consisting of methylamine, formamide, and acetamine. In an ice water bath environment, the haloid acid is added to the obtained solution where the molar ratio of the added haloid acid to the organic amine is (1~3): 1. The mixture containing the haloid acid is continuously stirred in the ice water bath environment for 2 hours to obtain a clear solution, then evaporating the clear solution with a rotary evaporator at 50 centigrade under a pressure −0.1 MPa to remove the solvent and obtain crystalline powder of the organic ammonium halide. The crystalline powder is washed with diethyl ether several times, filtered and dried in a vacuum drying oven at 50 centigrade under a pressure −0.1 MPa for 4 hours to obtain the organic ammonium halide powder.

(2) In this step, the precursor solution obtained in step (1) is added to a second solvent to form an emulsion system. Specifically, the emulsion system is obtained by the following steps:

According to an embodiment of the present invention, the second solvent is placed on a magnetic mixer to be fast stirred, and the precursor solution is added to the second solvent, dropwise while stirring, of which the second solvent is one or more selected from a group consisting of 1-octadecene (ODE), n-hexane, cyclohexane and n-heptane, and the second solvent selected in this step is immiscible with the first solvent in step (1). It shall be noted that the term "immiscible" in the present invention particularly means that, when the first solvent and the second solvent are mixed, separation of layers occur in the mixed solution. Thus, an emulsion system may be simply formed by selecting two kinds of immiscible solvents as the first solvent and the second solvent, respectively.

Furthermore, according to an embodiment of the present invention, the precursor solution is added at an adding speed of 10 μL to 1 mL per minute, and the volume ratio of the added precursor solution to the second solvent is 1:(0.0001~10). According to an embodiment of the present invention, slowly dropping the precursor solution in a small amount is conducive to obtain the emulsion system. Thus, the precursor solution can be dropped via a microsyringe. After adding the precursor solution, the mixed solution is continuously stirred for 2 hours to obtain the emulsion system of the perovskite material.

(3) A demulsifier is added to the emulsion system so that the inorganic metal halide and the organic ammonium halide or the halide of cesium are self-assembled to obtain a perovskite quantum dot material. Specifically, according to an embodiment of the present invention, the demulsifier is added to the emulsion system of the perovskite material where the added volume ratio of the demulsifier to the second solvent is 1:(1~10). Thereafter, the emulsion system in which the demulsifier has been added is centrifuged by use of a centrifuge at a rotational speed of 7500 rpm for 4 minutes. After the centrifuging, supernatant is retained to obtain a perovskite quantum dot solution. Finally, the perovskite quantum dot solution is washed to remove the organic solvent. The solution from which the organic solvent has been removed is dried under vacuum to obtain powder, the power is the perovskite quantum dot material powder. According to an embodiment of the present invention, the demulsifier may be one or more selected from a group consisting of acetone, methanol, isopropanol, n-butanol and tert-butanol. Thus, pure quantum dot powder may be directly obtained using this method, and the quantum dot material in the powder can stably exist and not agglomerate, which enables the quantum dot material to be applied in more extensive fields Furthermore, by adjusting the amount of the demulsifier added in this step, being able to obtain products such as nanorods and nanosheets while obtaining the powdered quantum dot material. According to an embodiment of the present invention, when the volume ratio of the added demulsifier to the second solvent is 1:(5~20), a solution containing the nanorods and quantum dot material can be obtained. Powdered quantum dot material and nanorods can be obtained respectively by centrifuging in a later stage. When the volume ratio of the added demulsifier to the second solvent is 1:(1~5), a solution containing nanosheets, nanorods and the quantum dot material can be obtained. Therefore, a variety of perovskite materials with different morphologies may be obtained while obtaining the quantum dot material.

To be understood easily, the principle of making the perovskite quantum dot material via this method will be explained hereinafter: both the inorganic metal halide and the organic ammonium halide or the halide of cesium are soluble in the first solvent, they can exist therein in a dispersed form. In other words, there is no coordination reaction of the inorganic metal halide and the organic ammonium halide or the halide of cesium to cause a crystal nucleus or compound in the first solvent. When the precursor solution is added to the second solvent, since the first solvent contained in the precursor solution and the second solvent are immiscible, and the organic amine and organic acid added as surface ligands in advance into the first solvent and the second solvent are amphiphilic, the organic amine and organic acid can encapsulate the precursor solution containing the first solvent to form micelles. The precursor solution is encapsulated in the micelles, which may form small droplets and be dispersed in the second solvent, then form an emulsion system; after adding the demulsifier, a balance emulsion system is destroyed and the precursors in the small droplets are diffused into the second solvent and fast self-assembled to form perovskite crystal nucleus. Meanwhile, due to hydrogen bonds between the micelles without being destroyed and the perovskite crystal nucleus in the emulsion, the micelles are adsorbed on the surface of the crystal nucleus working as surface ligands to restrict the growth of the crystal nucleus and finally keep the size of the particles in nano-scale.

Furthermore, the perovskite quantum dot material made by the method of the present invention has aforementioned properties and advantages of the perovskite quantum dot material, and will not be repeated here.

In another aspect of the present invention, it discloses a semiconductor device. According to an embodiment of the present invention, the semiconductor device includes the aforementioned perovskite quantum dot material according to any embodiments of the present invention. Since the semiconductor device includes the quantum dot material, the semiconductor device has aforementioned properties and advantages of the quantum dot material, which will not be repeated here. Therefore, the quantum dot material is made at a corresponding position of the semiconductor device, which may improve effect of use of the device.

According to an embodiment of the present invention, the semiconductor may be electroluminescent devices, solar batteries, display devices and non-linear optical devices. Thus, the aforementioned quantum dot material can be applied to these devices to perform the aforementioned properties and advantages, thereby being able to improve the use effect of these devices.

It shall be noted that, the described properties and effects can be mutually applied to all aspects of the present invention, which will not be repeated here.

The present invention will be explained below through specific embodiments, and it shall be noted that the following specific embodiments are merely for illustrative purpose, and not to limit the scope of the present invention by any means. In addition, unless particularly stated, methods without giving specific conditions or steps are conventional methods, and reagents and materials adopted are commercially available.

Embodiment 1

This embodiment adopted oleic acid and 2-ethylhexylamine as surface ligands for making $CH_3NH_3PbI_3$ quantum dot, the following detailed steps are hereinafter:

(1) Preparation of methylammonium iodide mL a solution of 30% (mass percent) methylamine in ethanol (degree of purity >99.9%) was measured with a 10 mL transfer pipette, placed in a 100 mL round-bottomed flask and continuously stirred for 10 minutes until homogeneous.

In an ice water bath environment, 5 mL 57% (mass percent) hydroiodic acid was added to the obtained solution while stirred, and then continuously stirred in the ice water bath environment for 2 hours to obtain a clear solution, and the solution was distilled with a rotary evaporator at 50 centigrade under a reduced pressure of −0.1 MPa to remove the solvent. After the rotary distillation, the remain in the round-bottomed flask was washed with anhydrous diethyl ether three times, to which air pump filtration is performed and dried in a vacuum drying oven at 50 centigrade under a pressure of −0.1 MPa for 4 hours to obtain methylammonium iodide powders:

(2) Preparation of a precursor solution before reaction

A 10 mL isotope vial was taken, 0.2 mmol methylammonium iodide and 0.2 mmol lead iodide, and 40 L 2-ethylhexylamine via a microsyringe, 1 mL oleic acid via a dropper and 10 mL acetone were added thereto, to which ultrasonic treatment is performed for 5 minutes to obtain a clear and transparent yellowish-brown solution, which was then filtered with a 0.2 μm-pore size PTFE filter head to obtain clear filtrate as a precursor solution before reaction.

(3) Removal of oxygen from the precursor solution and a second solvent

Another 10 mL isotope vial was taken, and 10 mL toluene was added thereto. Air in the precursor solution and in n-hexane was drained away via nitrogen provided with a needle, and the precursor solution and toluene were then transferred to a glove box for next operation;

(4) Mixing of the precursor solution and the second solvent

Figure 2:
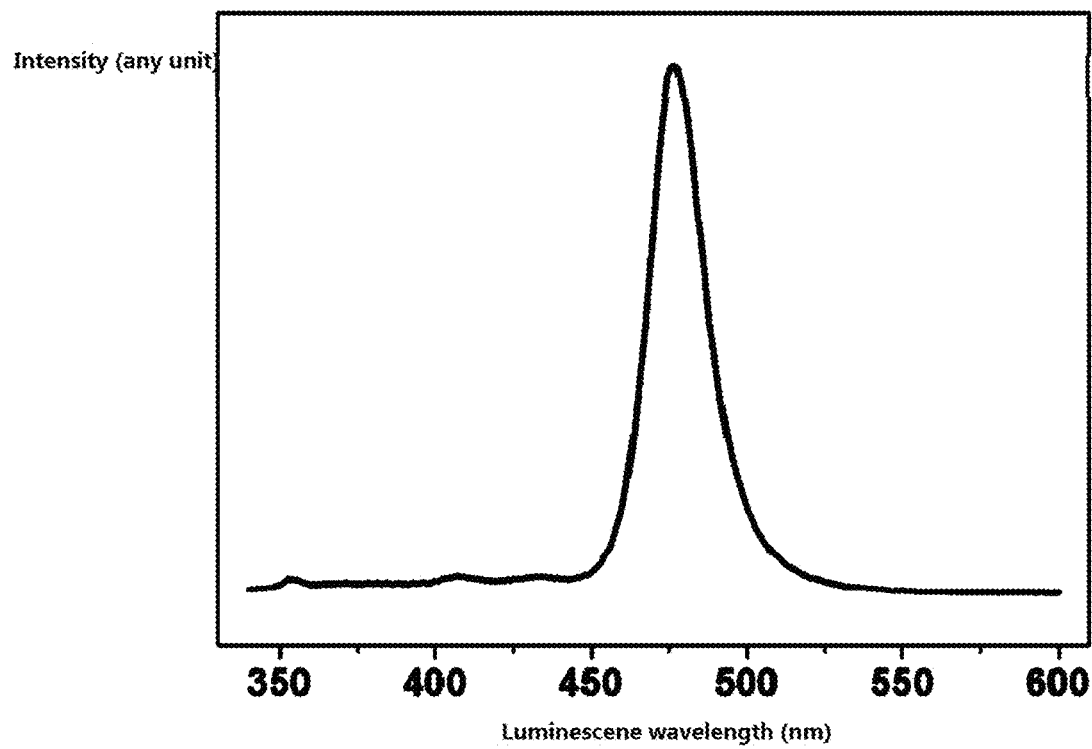
FIG. 2 is an emission spectrum of quantum dot according to the embodiment 1 of the present invention.

Toluene in step (3) was placed on a magnetic mixer to be fast stirred, and the precursor solution was extracted via a microsvringe and dropped dropwise into n-hexane while being fast stirred, where one drop (about 10 μL) is added every 30 seconds, until that 300 μL precursor solution was added, while monitored by an ultraviolet lamp. It can be observed that the solution of $CH_3NH_3PbI_3$ quantum dots was brown and emitted dim rose-carmine light under the ultraviolet lamp. Luminescence measured with fluorescence spectrometer of the quantum dot covered the near infrared region where the luminescence peak appeared at 726 nm. FIG. 2 was the fluorescence spectrogram of the obtained $CH_3NH_3PbI_3$ quantum dot.

In this embodiment, if 60 μL the 2-ethylhexylamine was added, the obtained quantum dot would have a luminescence wavelength of 740 nm, and if 20 μL the 2-ethylhexylamine was added, the obtained quantum dot would have a luminescence wavelength at 700 nm. That is, different ratios of the inorganic metal halide to the long-chain organic amine caused hybridized perovskite quantum dots having different luminescence wavelengths.

Embodiment 2

This embodiment adopted butyric acid and octadecylamine as surface ligands for preparing $CH_1NH_3PbCl_3$ quantum dot by the following specific steps:

(1) Preparation of methylammonium chloride 5 mL a methylamine in ethanol solution (degree of purity >99.9%) that its mass percent is 30% was measured via a 10 mL transfer pipette, placed in a 100 mL round-bottomed flask and stirred for 10 minutes until homogeneous. In an ice water bath environment, 5 mL 37% (mass percent) concentrated hydrochloric acid was added to the obtained solution while stirred, and then continuously stirred in the ice water bath environment for 2 hours to obtain a clear solution, and the solution was evaporated with a rotary evaporator at 50 centigrade under a pressure of −0.1 MPa to remove the solvent. The remain in the round-bottomed flask was washed with anhydrous diethyl ether three times, to which air pump filtration is performed and dried in a vacuum drying oven at 50 centigrade under a pressure of −0.1 MPa for 4 hours to obtain methylammonium chloride powder;

(2) Preparation of a precursor solution before reaction

A 10 mL isotope vial was taken, and to the vial was added 0.2 mmol methylammonium chloride, 0.2 mmol lead chloride, 0.4 mmol octadecylamine, 1 mL butyric acid using a dropper and 10 mL dimethyl sulfoxide, and performing ultrasonic treatment for 5 minutes to obtain a clear transparent colorless solution, which was then filtered with a 0.2 μm-pore size PTFE filter head to obtain clear filtrate as a precursor solution before reaction;

(3) Preparation of a second solvent

Another 10 mL isotope vial was taken, to which 10 mL chloroform was then added, and placed on a magnetic mixer to be fast stirred for next operation:

(4) Preparation of a quantum dot solution

The precursor solution was drawn by a microsyringe and dropped dropwise into chloroform which was being fast stirred in step (3), of which one drop (about 10 μL) is added every 30 seconds, until that 1 mL the precursor solution was added, while monitored with the ultraviolet lamp. It could be observed that the solution of $CH_3NH_3PbCl_3$ quantum dot in chloroform was light blue and emitting purple light under irradiation of the ultraviolet lamp. Luminescence measured via a fluorescence spectrometer, of the quantum dot covered the violet region with luminescence peak appearing at 406 nm.

(5) Obtaining quantum dot powder

The quantum dot solution obtained in step (4) was transferred to a distillation flask and distilled with a vacuum distillation unit to remove the organic solvents, and the remaining solid was dried in a vacuum drying oven for 8 hours to obtain crystalline powder of $CH_3NH_3PbCl_3$ quantum dots that were white.

Embodiment 3

This embodiment adopted propionic acid and n-hexylamine as surface ligands for preparing $CH_3NH_3PbBr_3$ quantum dot by the following specific steps:

(1) Preparation of methylammonium bromide 5 mL a solution of 30% (mass percent) methylamine in ethanol (degree of purity >99.9%) was measured with a 10 mL transfer pipette, placed in a 100 mL round-bottomed flask and stirred for 10 minutes until homogeneous. In an ice water bath environment, 5 mL 49% (mass percent) hydrobromic acid was added to the obtained solution while stirred, and then continuously stirred in the ice water bath environment for 2 hours to obtain a clear solution, and the solution was distilled with a rotary evaporator at 50 centigrade under a reduced pressure of −0.1 MPa to remove the solvent. The remain in the round-bottomed flask was washed with anhydrous diethyl ether three times, to which the air pump filtration is performed and dried in a vacuum drying oven at 50 centigrade under a pressure of −0.1 MPa for 4 hours to obtain methylammonium bromide powder;

(2) Preparation of a precursor solution before reaction

A 10 mL isotope vial was taken, 0.2 mmol methylammonium bromide and 0.2 mmol lead bromide, and then 0.4 mmol n-hexylamine, 1 mL propionic acid via a dropper and 10 mL N,N-dimethyl formamide were added thereto, to which ultrasonic treatment is performed for 5 minutes to obtain a clear transparent solution, which was then filtered with a 0.2 μm-pore size PTFE filter head to obtain clear filtrate as a precursor solution before reaction.

(3) Preparation of a second solvent

Another 10 mL isotope vial was taken, to which 10 mL toluene was then added, and placed on a magnetic mixer to be fast stirred for next operation:

(4) Preparation of a quantum dot solution

The precursor solution was drawn using a microsyringe and dropped dropwise into toluene which was being fast stirred in step (3), of which one drop (about 10 μL) is added every 30 seconds, until that 1 mL the precursor solution was added, while monitored with the ultraviolet lamp. It could be observed that yellowish-brown turbidity appeared in the toluene solution and the solution exhibited green color under the ultraviolet lamp;

(5) Post-treatment of the quantum dot solution

Figure 3:
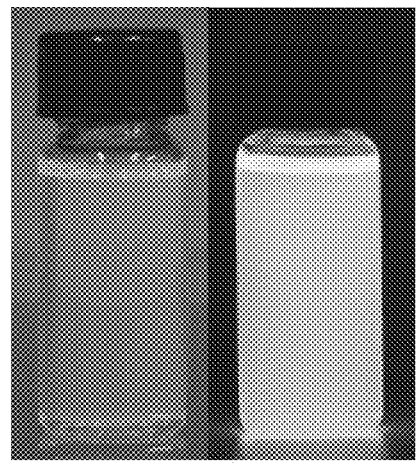
FIG. 3 is digital images of a quantum dot solution under a fluorescent lamp and an ultraviolet lamp according to the embodiment 3 of the present invention.
Figure 4:
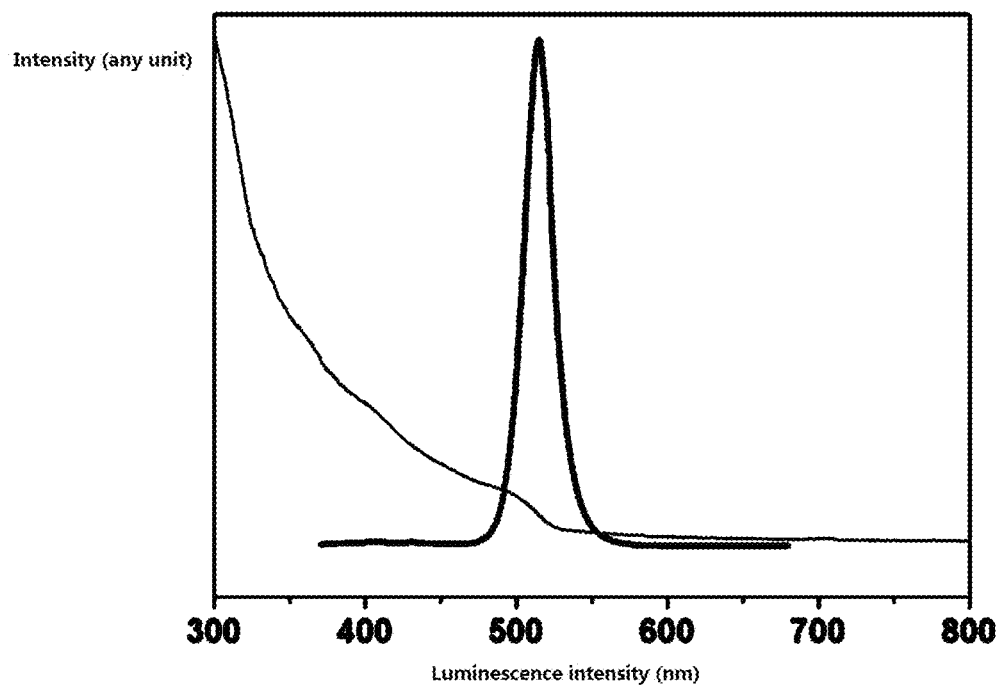
FIG. 4 is an absorption spectrum and an emission spectrum of the quantum dot according to the embodiment 3 of the present invention.
Figure 5:
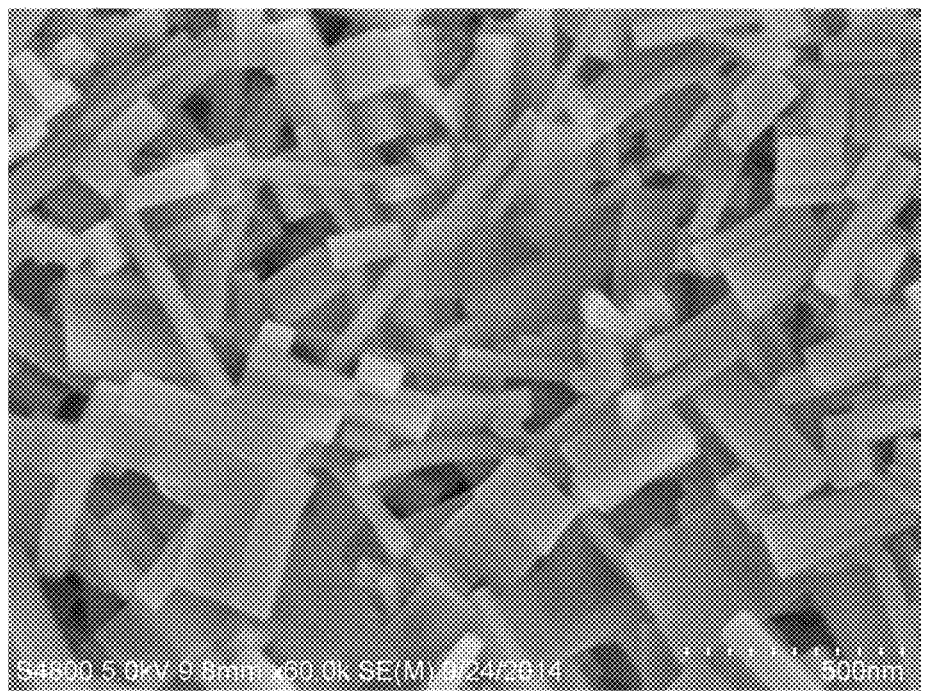
FIG. 5 is a scanning electron microscopy image of a precipitate according to the embodiment 3 of the present invention.

The quantum dot solution obtained in step (4) was transferred to a centrifuge tube to be centrifuged at 7500 rpm for 10 minutes, and it could be observed that the upper layer is a bright green solution, and the lower layer is dark yellow precipitate. The supernatant was drawn out to obtain the solution of $CH_3NH_3PbBr_3$ quantum dots. FIG. 3 is images of the obtained $CH_3NH_3PbBr_3$ quantum dots under a fluorescent lamp and the ultraviolet lamp; FIG. 4 is an absorption spectrum and an emission spectrum of the quantum dot, and shows luminescence peak of the quantum dot at 515 nm. The precipitate is hybridized perovskite nanosheets or nanorods, and FIG. 5 is a scanning electron microscopy image of the precipitate.

(6) Obtaining quantum dot powder

Figure 6:
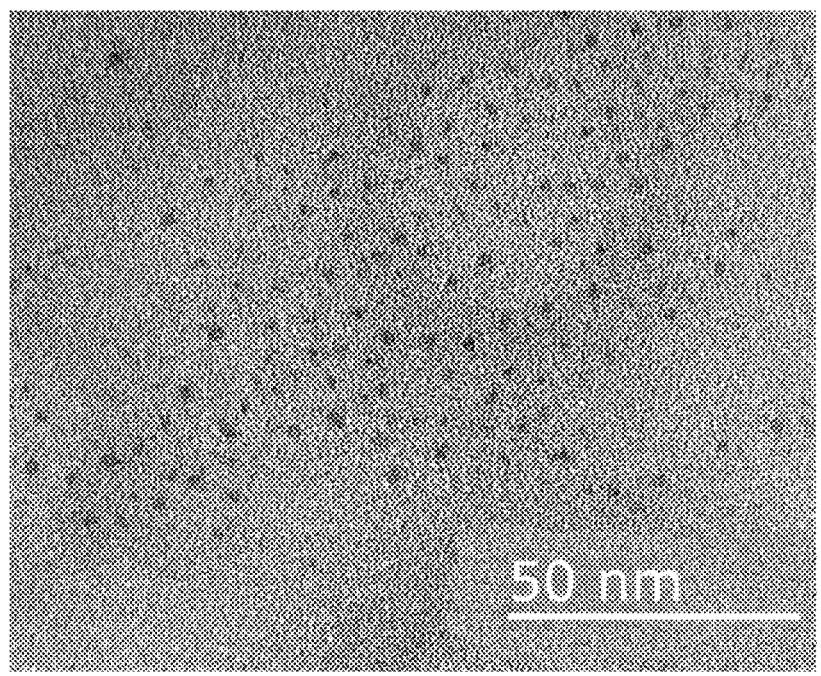
FIG. 6 is a transmission electron microscopy image of the quantum dots according to the embodiment 3 of the present invention.

The bright green supernatant obtained in step (4) was transferred to a distillation flask and distilled with a vacuum distillation unit to remove the organic solvents, and the remaining solid was dried in a vacuum drying oven for 8 hours to obtain crystalline powder of $CH_3NH_3PbBr_3$ quantum dots, which was yellowish-green. FIG. 6 is a transmission electron microscopy image of the quantum dots.

In step (2) of this embodiment, if the surface ligands (n-hexylamine and propionic acid) are not added to the first solvent, but to the second solvent in step (3), a hybridized perovskite quantum dot material can be also obtained.

Embodiment 4

This embodiment adopted n-octylamine as a surface ligand for preparing $(C_2H_5NH_3)_2GeI_4$ quantum dot by the following specific steps:

(1) Preparation of ethylammonium iodide 5 mL ethylamine (degree of purity >99.9%) was measured with a 10 mL transfer pipette, diluted with absolute ethanol into a solution where the volume percentage of ethylamine was 40%, and placed in a 100 mL round-bottomed flask and stirred for 10 minutes until homogeneous. In an ice water bath environment, 5 mL 49% (mass percent) hydroiodic acid was added to the obtained solution while stirred, and then continuously stirred in the ice water bath environment for 2 hours to obtain a clear solution. The solution was distilled with a rotary evaporator at 50 centigrade under a reduced pressure −0.1 MPa to remove the solvent. The remain in the round-bottomed flask was washed with anhydrous diethyl ether three times, to which the air pump filtration is performed and dried in a vacuum drying oven at 50 centigrade under a pressure of −0.1 MPa for 4 hours to obtain ethylammonium iodide powder:

(2) Preparation of a precursor solution before reaction

A 10 mL isotope vial was taken, 0.2 mmol ethylammonium iodide and 0.2 mmol germanium iodide, 40 μL n-octylamine via a microsyringe and 10 mL acetonitrile via a dropper were added thereto, and to which ultrasonic treatment is performed for 5 minutes to obtain a clear transparent solution, which was then filtered with a 0.2 μm-pore size PTFE filter head to obtain clear filtrate as a precursor solution before reaction.

(3) Preparation of a second solvent

Another 10 mL isotope vial was taken, to which 10 mL diethyl ether was then added, and placed on a magnetic mixer to be fast stirred for next operation:

(4) Preparation of a quantum dot solution

The precursor solution was drawn using a microsyringe and dropped dropwise into diethyl ether which was being fast stirred in step (3), of which one drop (about 10 μL) is added every 5 seconds, until 2 mL the precursor solution was added. It could be observed that turbidity appeared in the solution.

(5) Centrifuging to obtain a clear solution

The solution obtained in step (4) was transferred to a centrifuge tube to be centrifuged at 7000 rpm for 4 minutes, and supernatant was drawn out by a dropper, which was an ink black solution with luminescence in the infrared region.

Embodiment 5

This embodiment adopted oleyl amine and n-hexylamine as surface ligands for making $CH_3NH_3PbCl_xBr_{3-x}$ (0≤x≤3) quantum dots by the following steps:

(1) Preparation of methylammonium chloride

A 10 mL isotope vial was taken, and to the vial, added 0.2 mmol methylammonium chloride, 0.2 mmol lead bromide, 40 μL n-hexylamine by use of a microsyringe, 1 mL oleyl amine by use of a dropper and 10 mL N,N-dimethyl formamide, to which ultrasonic treatment is performed for 5 minutes to obtain a clear transparent solution that was then filtered with a 0.2 μm-pore size PTFE filter head to obtain clear filtrate as a precursor solution before reaction;

(3) Preparation of a second solvent

Another 10 mL isotope vial was taken, to which 10 mL chloroform was then added, and placed on a magnetic mixer to be fast stirred for next operation:

(4) Preparation of a quantum dot solution

The precursor solution was drawn by use of a microsyringe and added to chloroform. dropwise, that was being fast stirred in step (3), of which one drop (about 10 μL) is added every 10 seconds, until 1 mL the precursor solution was added. It could be observed that the solution became turbid gradually and greenish particles were produced;

(5) centrifuging

Figure 7:
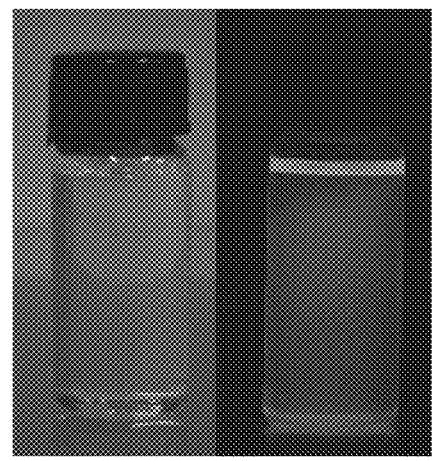
FIG. 7 is digital images of a quantum dot solution under a fluorescent lamp and an ultraviolet lamp according to the embodiment 5.
Figure 8:
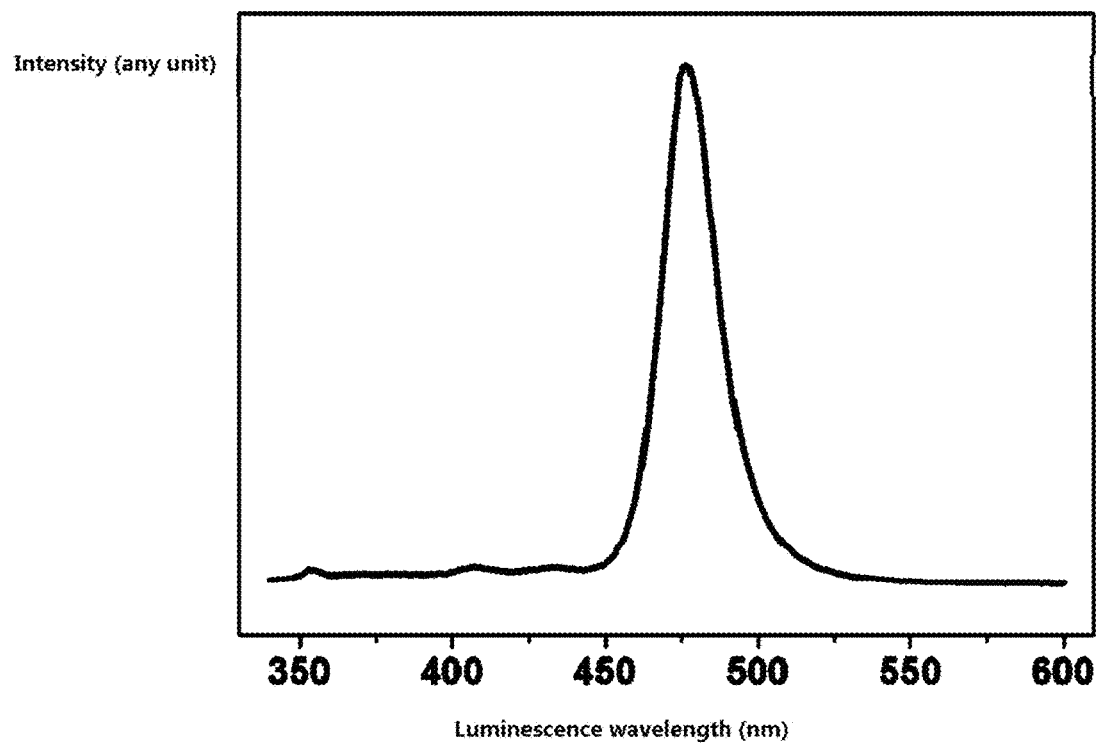
FIG. 8 is an emission spectrum of the quantum dot according to the embodiment 5 of the present invention.

The turbid solution obtained in step (4) was transferred to a centrifuge tube and centrifuged at 7500 rpm for 10 minutes to result in light blue supernatant and cyan precipitate. The supernatant exhibited blue color under irradiation of an ultraviolet lamp. FIG. 7 shows images of the quantum dot solution under the fluorescent and ultraviolet lamps; FIG. 8 shows emission spectrum of the quantum dots.

Embodiment 6

This embodiment adopted oleic acid and n-octylamine as surface ligands for making $CH_3NH_3PbI_xBr_{3-x}$ (0≤x≤3) quantum dots by the following steps:

(1) Preparation of methylammonium bromide

The preparation method of methylammonium bromide was the same as that described in step (1) of embodiment 3:

(2) Preparation of a precursor solution before reaction

A 10 mL isotope vial was taken, and to the vial, added 0.2 mmol methylammonium bromide, 0.2 mmol lead iodide, 40 μL n-octylamine by use of a microsyringe, 1 mL oleic acid by use of a dropper and 10 mL tetrahydrofuran (THF), to which ultrasonic treatment is performed for 5 minutes to obtain a clear transparent light yellow solution that was then filtered with a 0.2 μm-pore size PTFE filter head to obtain clear filtrate as a precursor solution before reaction:

(3) Preparation of a second solvent

Another 10 mL isotope vial was taken, to which 10 mL cyclohexane was then added, then placed on a magnetic mixer to be fast stirred for next operation:

(4) Preparation of a quantum dot solution

The precursor solution was drawn using a microsyringe and added to the cyclohexane dropwise which was being fast stirred in step (3), of which one drop (about 10 μL) is added every 5 seconds, and upon 100 μL the precursor solution was added, continuously stirred for 5 minutes, and then added another 100 μL the precursor solution, repeated until 1 mL the precursor solution was added into. It could be observed that the solution of the $CH_3NH_3PbI_xBr_{3-x}$ quantum dots was black red, emitting dark red light under the ultraviolet lamp and measured via a spectrometer that a luminescence peak is at 650 nm.

(5) Obtaining the quantum dot powder

The black red quantum dot solution obtained in step (4) was transferred to a distillation flask, and distilled via a vacuum distillation unit to remove the organic solvents and obtain crystalline powder of the $CH_3NH_3PbI_xBr_{3-x}$ quantum dots, which is black red powder;

(6) Encapsulating the quantum dot powder

The quantum dot powder obtained in step (5) was re-dissolved in toluene. An amount of PMMA was measured and added to a solution of quantum dots in cyclohexane so that the mass percent of the PMMA in the solution was 5%. The mixed solution was equally spread on a watchglass and placed in a fume cupboard. After cyclohexane was completely volatilized, shaped PMMA film was taken off the watchglass to obtain a composite film of the quantum dots and PMMA, which was dark red.

Embodiment 7

This embodiment adopted hexanoic acid and laurylamine as surface ligands for making $CH_3NH_3SnI_3$ quantum dot by the following steps:

(1) Preparation of methylammonium iodide

The method of making methylammonium iodide was the same as that described in step (1) of Embodiment 1:

(2) Preparation of a precursor solution before reaction

A 10 mL isotope vial was taken, and to the vial was added 0.2 mmol methylammonium iodide, 0.2 mmol stannic iodide, 40 μL laurylamine by use of a microsyringe, mL hexanoic acid via a dropper and 10 mL N,N-dimethyl formamide, to which ultrasonic treatment was performed for 5 minutes to obtain a clear transparent solution, which was then filtered a 0.2 μm-pore size PTFE filter head to obtain clear filtrate as a precursor solution before reaction.

(3) Preparation of a second solvent

Another 10 mL isotope vial was taken, to which 10 mL cyclohexane was added for next operation:

(4) Removal of oxygen from the precursor solution and the second solvent

Isotope vials containing the precursor solution and the second solvent were respectively sealed via a rubber plug, and oxygen in the precursor solution and the second solvent was drained away via nitrogen, then the precursor solution and the second solvent were transferred to a glove box:

(5) Preparation of a quantum dot solution

Cyclohexane in which oxygen had been drained away in step (4) was placed on a magnetic mixer to be fast stirred, and the precursor solution was drawn by a microsyringe and added to cyclohexane dropwise which was being fast stirred, of which one drop (about 10 μL) is added every 30 seconds, until 100 μL the precursor solution was added. It could be observed that obtained solution of $CH_3NH_3SnI_3$ was black.

Embodiment 8

This embodiment adopted oleic acid as a surface ligand for making $(C_6H_5NH_3)_2PbI_4$ quantum dot by the following steps:

(1) Preparation of phenylethylammonium iodide 5 mL phenylethylamine was measured by a 10 mL transfer pipette and placed in a 100 mL round-bottomed flask, then 7.5 mL absolute ethanol was added thereto, to dilute it into a solution of 40% (volume percent) phenylethylamine in ethanol. The solution was stirred for 10 minutes until homogeneous. In an ice water bath environment, 4 mL 57% (mass percent) hydroiodic acid was added to it while stirred, and continuously stirred in the ice water bath environment for 2 hours to obtain a clear solution, evaporated the solution with a rotary evaporator at 50 centigrade under a pressure of −0.1 MPa to remove the solvent and to obtain crystalline the phenylethylammonium powder (2) Preparation of a precursor solution before reaction A 10 mL isotope vial was taken, then to the vial, 0.2 mmol phenylethylammonium iodide, 0.2 mmol lead iodide, 1 mL oleic acid via a dropper and 10 mL N,N-dimethyl formamide were added, to which ultrasonic treatment is performed for 5 minutes to obtain a clear transparent mixed solution that was then filtered with a 0.2 μm-pore size PTFE filter head to obtain clear filtrate as a precursor solution before reaction;

(3) Preparation of a second solvent

Another 10 mL isotope vial was taken, to which 10 mL chloroform was added, and placed on a magnetic mixer to be fast stirred for next operation:

(4) Preparation of a quantum dot solution

Figure 9:
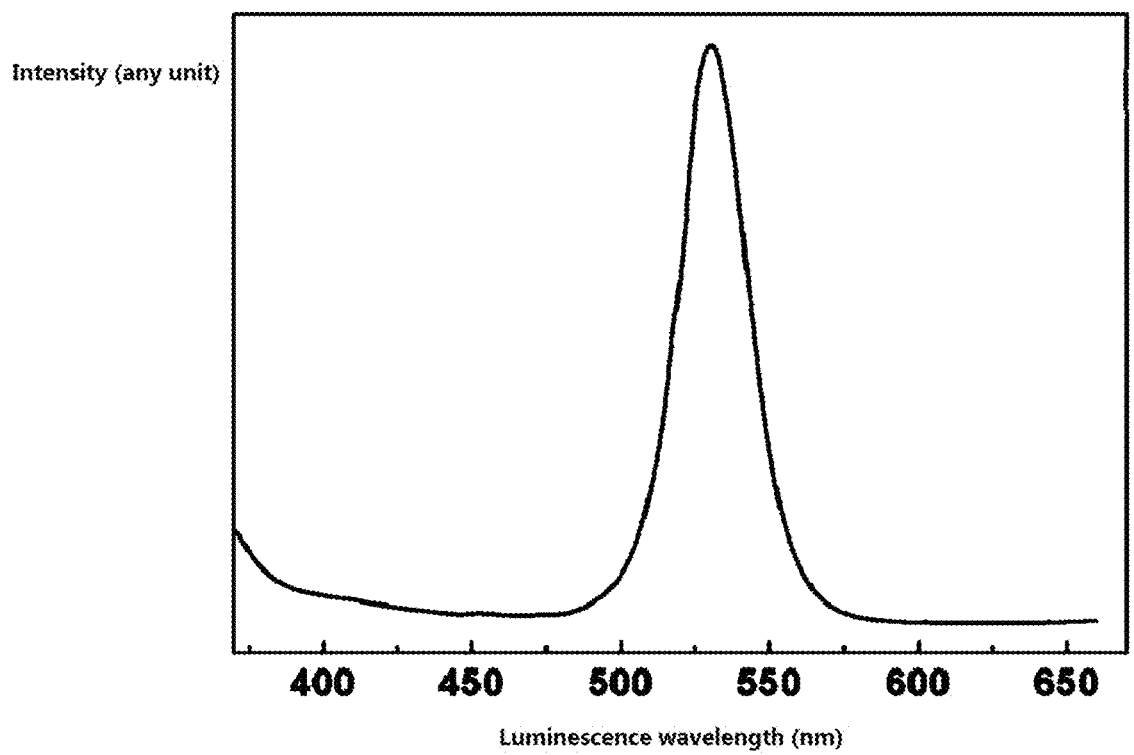
FIG. 9 is an emission spectrum of quantum dot according to the embodiment 8 of the present invention.

The precursor solution was drawn via a microsyringe and added to chloroform dropwise which was being fast stirred in step (3), of which one drop (about 10 μL) is added every 5 seconds, until that 0.5 mL the precursor solution was added. It could be observed that the obtained chloroformic solution of $(C_6H_5NH_3)_2PbI_4$ quantum dots is light yellow, the luminescence peak of the quantum dots is at 530 nm. FIG. 9 is the emission spectrum of the quantum dots.

Embodiment 9

1 This embodiment adopted decoic acid as a surface ligand for making $CH_3NH_3CuBr_3$ quantum dot by the following steps:

(1) Preparation of methylammonium bromide

The method for making methylammonium bromide was the same as that described in step (1) of Example 3;

(2) Preparation of a precursor solution before reaction

A 10 mL isotope vial was taken, then to the vial, 0.2 mmol methylammonium bromide and 0.2 mmol copper bromide, 1 mL decoic acid via a microsyringe and 10 mL N,N-dimethyl formamide were added, to which ultrasonic treatment is performed for 5 minutes to obtain a clear transparent mixed solution that was then filtered via a 0.2 μm-pore size PTFE filter head to obtain clear filtrate as a precursor solution before reaction;

(3) Preparation of a second solvent

Another 10 mL isotope vial was taken, to which 10 mL toluene was added, and placed on a magnetic mixer to be fast stirred for next operation:

(4) Preparation of a quantum dot solution

The precursor solution was drawn via a microsyringe and added to toluene dropwise which was being fast stirred in step (3). of which one drop is added every 30 seconds, until that 0.5 mL the precursor solution was added. It could be observed that the obtained toluene solution of $CH_3NH_3CuBr_3$ quantum dots exhibit the color of dark purple.

Embodiment 10

This embodiment adopted pentanoic acid and 3-vinylhexylamine as surface ligands for making $(C_6H_5NH_3)_2BiCl_4$ quantum dot by the following steps:

(1) Preparation of phenylethylammonium iodide

The method for making phenylethylammonium iodide was the same as that described in step (1) of embodiment 8.

(2) Preparation of a precursor solution before reaction

A 10 mL isotope vial was taken, to the vial, 0.2 mmol phenylethylammonium iodide, 0.2 mmol bismuth chloride, 1 ml pentanoic acid via a dropper, 40 µL 3-vinvlhexylamine and 10 mL DMSO were added, to which ultrasonic treatment was performed for 5 minutes to obtain a clear transparent mixed solution that was then filtered with a 0.2 µm-pore size PTFE filter head to obtain clear filtrate as a precursor solution before reaction;

(3) Preparation of a second solvent

Another 10 mL isotope vial was taken, to which 10 mL cyclohexane was added, and placed on a magnetic mixer to be fast stirred for next operation:

(4) Preparation of a quantum dot solution

The precursor solution was drawn via a microsyringe and added to cyclohexane dropwise which was being fast stirred in step (3), of which one drop is added every 5 seconds, until that 0.5 mL the precursor solution was added. It could be observed that the obtained solution of $(C_6H_5NH_3)_2BiCl_4$ quantum dots was colorless.

Embodiment 11

This embodiment adopted octanoic acid and hexadecylamine as surface ligands for making $CH_3NH_3MnI_3$ quantum dot by the following steps:

(1) Preparation of methylammonium iodide

The method for making methylammonium iodide was the same as that described in step (1) of Example 1:

(2) Preparation of a precursor solution before reaction

A 10 mL isotope vial was taken, and to the vial, 0.2 mmol methylammonium iodide, 0.2 mmol manganese iodide, 1 mL octanoic acid via a dropper, 40 µL hexadecylamine and 10 mL acetone were added, to which ultrasonic treatment is performed for 5 minutes to obtain a clear transparent mixed solution that was then filtered with a 0.2 µm-pore size PTFE filter head to obtain clear filtrate as a precursor solution before reaction.

(3) Preparation of a second solvent

Another 10 mL isotope vial was taken, to which 10 mL cyclohexane was added, and placed on a magnetic mixer to be fast stirred for next operation:

(4) Preparation of a quantum dot solution

The precursor solution was drawn via a microsyringe and added to cyclohexane dropwise which was being fast stirred in step (3), of which one drop is added every 5 seconds until that 0.5 mL the precursor solution was added. It could be observed that the obtained solution of $CH_3NH_3MnI_3$ quantum dots was purple-black.

Embodiment 12

This embodiment adopted butylamine as a surface ligand for making $CH_3NH_3SbCl_3$ quantum dot by the following steps:

(1) Preparation of methylammonium chloride

The method for making methylammonium chloride was the same as that described in step (1) of Embodiment 2.

(2) Preparation of a precursor solution before reaction

A 10 mL isotope vial was taken, and to the vial, 0.2 mmol methylammonium chloride, 0.2 mmol antimony chloride, 40 µL octylamine using a dropper and 10 mL acetone were added, to which ultrasonic treatment is performed for 5 minutes to obtain a clear transparent mixed solution that was then filtered with a 0.2 µm-pore size PTFE filter head to obtain clear filtrate as a precursor solution before reaction;

(3) Preparation of a second solvent

Another 10 mL isotope vial was taken, to which 10 mL n-hexane was added, and placed on a magnetic mixer to be fast stirred for next operation:

(4) Preparation of a quantum dot solution

The precursor solution was drawn via a microsyringe and added to n-hexane dropwise which was being fast stirred in step (3), of which one drop is added every 5 seconds until that 0.5 mL the precursor solution was added. It could be observed that the obtained solution of $CH_3NH_3SbCl_3$ quantum dots was colorless.

Embodiment 13

This embodiment adopted 2-butyl tetradecyl amine as a surface ligand for making $(CH_2=CHCH_2CH_3NH_3)_2SnI_4$ quantum dot by the following steps:

(1) Preparation of 3-butenyl-1-ammonium iodide

The method for making 3-butenyl-1-ammonium iodide was the same as that described in step (1) of embodiment 4, except that ethylamine in step (1) was replaced with 4-amino-1-butene;

(2) Preparation of a precursor solution before reaction

A 10 mL isotope vial was taken, and to the vial was added 0.2 mmol 3-butenyl-1-ammonium iodide, 0.2 mmol stannic iodide, 40 µL 2-butyl tetradecyl amine via a dropper and 10 mL THF, to which ultrasonic treatment was performed for 5 minutes to obtain a clear transparent light red mixed solution that was then filtered with a 0.2 µm-pore size PTFE filter head to obtain clear filtrate as a precursor solution before reaction.

(3) Preparation of a second solvent

Another 10 mL isotope vial was taken, to which 10 mL chloroform was added, and placed on a magnetic mixer to be fast stirred for next operation:

(4) Preparation of a quantum dot solution

The precursor solution was drawn via a microsyringe and added to chloroform dropwise which was being fast stirred in step (3), of which one drop is added every 5 seconds until that 0.5 mL the precursor solution was added. It could be observed that the obtained solution of $(CH_2=CHCH_2CH_3NH_3)_2SnI_4$ quantum dots was red.

Embodiment 14

This embodiment was based on obtained $CH_3NH_3PbBr_3$ quantum dots to construct a trans-electroluminescent device by the following steps:

(1) Preparation of a ITO (indium tin oxide) conductive glass substrate

The ITO conductive glass was cut into square bases with a size of 2.5*2.5 cm$^2$, washed with deionized water and then put into acetone and isopropanol for the ultrasonic treatment for 15 minutes successively, and the cleaned ITO conductive glasses were soaked in isopropanol for usage;

(2) Preparation of spin-coating solution

Two isopropoxide dual ancetylacetone ti (abbreviated to 'TIPD') was dissolved in isopropanol to prepare a spin-coating solution for the electron transport layer material, of which the mass percent of TIPD was 25%; dissolving the prepared hybridized perovskite quantum dots of which concentration is maintained at 10 mg/ml, into the toluene, to prepare a spin-coating solution for the quantum dot layer; poly(bis(4-phenyl)(4-butylphenyl)amine) (abbreviated to 'poly-TPD') powder was dissolved in chlorobenzene to form a spin-coating solution for the hole transport material, of which the mass percent of poly-TPD is 10%. The above spin-coating solutions were respectively filtered via a 0.22 μm filter head then the filtrates were transferred to sample bottles for usage:

(3) Spin-coating

1 The obtained ITO conductive glass was taken out and placed on a rotary plate of a spin coater. The spin-coating solution of TIPD in isopropanol was drawn via a microsyringe and dropped on the ITO surface to uniformly cover the ITO surface that was then spin-coated at 2000 rpm for 30 seconds. In the same way, the quantum dot layer and the hole transport layer (poly-TPD) were spin-coated successively, and the method for spin-coating them was the same as that mentioned above. Every time the spin-coating was finished, the ITO was placed on a hot platform to be quenched at 70 centigrade for 15 minutes:

(4) Deposition electrode

Figure 10:
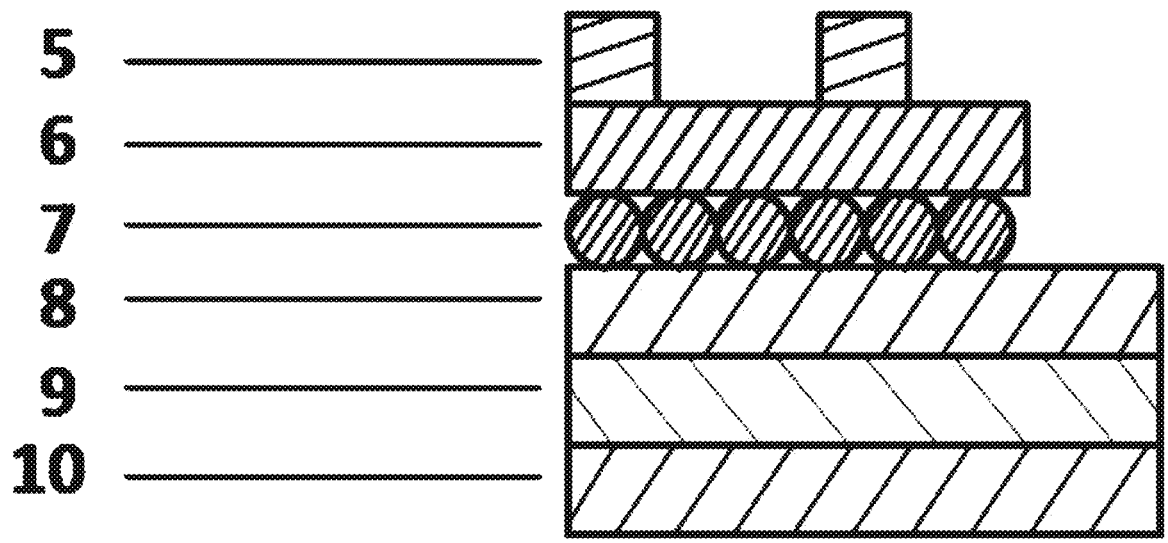
FIG. 10 is a structural schematic diagram of an electroluminescent device according to the embodiment 8 of the present invention.

A layer of Al electrode with a thickness of 100 nm was deposited via a vacuum coating instrument on the poly-TPD hole transport layer. FIG. 10 is a structural schematic view of the constructed electroluminescence device. A voltage was applied across the electrode and it could be observed that the device emitted bright green light, and the intensity of the light was gradually increasing along with increasing of the voltage.

Embodiment 15

This embodiment adopted n-octylamine as a surface ligand for pmaking CsPbBr3 quantum dot by the following steps:

(1) Preparation of cesium oleate

A 100 mL three-necked flask was taken and 2.5 mmmol cesium carbonate, 30 ml octadecene via a graduated cylinder and 2.5 mL oleic acid via a dropper were added thereto, heated to 120 centigrade, being in vacuum for reaction for 1 hours, then warmed up to 150 centigrade until that the cesium carbonate was completely dissolved to get a brown solution, and to take a clear solution as a precursor solution before reaction.

(2) Preparation of lead bromide solution

Another 5 mL isotope vial was taken, 0.38 mmol lead bromide and 0.6 mL of N,N-dimethyl formamide via a dropper were added thereto, to which ultrasonic treatment was performed for 5 minutes to obtain a clear transparent solution.

(3) Preparation of a second solvent

A 30 mL isotope vial was taken, 10 mL n-hexane, 2 mL oleic acid, 0.5 mL n-octylamine, 0.4 mL cesium oleate precursor solution made in step (1) and 0.2 mL N,N-dimethyl formamide were added thereto, the vial was placed on a magnetic mixer to be fast stirred for next operation:

(4) Preparation of a quantum dot solution

The lead bromide solution was drawn via a microsyringe and added to the solution dropwise which was being fast stirred in step (3), of which one drop (about 10 μL) is added every 10 seconds until that the precursor solution was completely added, 8 mL acetone was added via a dropper, and it was observed that the solution gradually became turbid and yellowish green particles were formed;

(5) Centrifuging

The turbid solution obtained in step (4) was transferred to a centrifuge tube and centrifuged at 7000 rpm for 10 minutes to get a colorless supernatant and yellowish green precipitate. The precipitate presented blue color under irradiation of the ultraviolet lamp. The precipitate was dissolved in n-hexane to obtain the quantum dot solution.

Embodiment 16

This embodiment adopted n-hexylamine as a surface ligand. N,N-dimethyl formamide as the first solvent, and n-hexane as the second solvent for making $CH_3NH_3PbBr_3$ quantum dot by the following steps:

(1) Preparation of methylammonium bromide 5 mL a solution of 30% (mass percent) methylamine in ethanol (degree of purity >99.9%) was measured via a 10 mL transfer pipette, placed in a 100 mL round-bottomed flask and stirred for 10 minutes until homogeneous. In an ice water bath environment, 5 mL 49% (mass percent) hydrobromic acid was added to the obtained stirred solution then which is continuously stirred in the ice water bath environment for 2 hours to obtain a clear solution, and the solution was distilled with a rotary evaporator at 50 centigrade under a reduced pressure of −0.1 MPa to remove the solvent. The remain in the round-bottomed flask was washed with anhydrous diethyl ether three times, to which air pump filtration is performed and dried in a vacuum drying oven at 50 centigrade under a pressure of −0.1 MPa for 4 hours to obtain powder of methylammonium bromide;

(2) Preparation of a precursor solution before reaction

A 10 mL isotope vial was taken, 0.2 mmol methylammonium bromide, 0.2 mmol lead bromide, 0.4 mmol n-hexylamine, 1 mL propionic acid via a dropper and 1 mL N,N-dimethyl formamide were added thereto, to which ultrasonic treatment is performed for 5 minutes to obtain a clear colorless solution that was then filtered with a 0.2 μm-pore size PTFE filter head to obtain clear filtrate as a precursor solution before reaction.

(3) Preparation of a second solvent

Another 10 mL isotope vial was taken, to which 10 mL n-hexane was added, and placed on a magnetic mixer to be fast stirred for next operation:

(4) Preparation of quantum dot emulsion

The precursor solution was drawn via a microsyringe and added into n-hexane dropwise which was being fast stirred in step (3) while monitored under the ultraviolet lamp, until that the precursor solution was completely added.

(5) Demulsification 5 mL tert-butanol was added to the solution obtained in step (4) and transferred to a centrifuge tube and centrifuged at 7500 rpm for 10 minutes. After supernatant was poured out, the precipitate was the $CH_3NH_3PbBr_3$ quantum dot.

Embodiment 17

This embodiment adopted n-octylamine as surface ligands, dimethyl sulfoxide as the first solvent and n-hexane as the second solvent for making CHOHNH$_3$PbI$_3$ nanosheets by the following steps:

(1) Preparation of formylammonium bromide

The method for making formylammonium bromide was the same as that of methylammonium bromide:

(2) Preparation of a precursor solution before reaction

A 10 mL isotope vial was taken, 0.2 mmol formylammonium bromide, 0.2 mmol lead iodide, 0.4 mmol n-octylamine, 1 mL propionic acid via a dropper and 10 mL dimethyl sulfoxide were added thereto, to which ultrasonic treatment is performed for 5 minutes to obtain a clear colorless solution that was then filtered with a 0.2 μm-pore size PTFE filter head to obtain clear filtrate as a precursor solution.

(3) Preparation of a second solvent

Another 10 mL isotope vial was taken, to which 10 mL n-hexane was added, and placed on a magnetic mixer to be fast stirred for next operation:

(4) Preparation of quantum dot emulsion

The precursor solution was drawn via a microsyringe and added into n-hexane dropwise which was being fast stirred in step (3), while monitored under the ultraviolet lamp, until that the precursor solution was completely added.

(5) Demulsification 10 mL methanol was added to the solution obtained in step (4) and continuously stirred for 30 minutes and then transferred to a centrifuge tube to be centrifuged at 7500 rpm for 10 minutes. After supernatant was poured out, the precipitate was CHOHNH$_3$PbI$_3$ nanosheets.

Embodiment 18

This embodiment adopted oleyl amine as a surface ligand, dimethyl sulfoxide as the first solvent and n-heptane as the second solvent for making CH$_3$CHONH$_3$PbCl$_3$ nanowires by the following steps:

(1) Preparation of acetylammonium chloride

The method for making acetylammonium chloride was the same as that of methylammonium chloride;

(2) Preparation of a precursor solution before reaction

A 10 mL isotope vial was taken, 0.2 mmol acetylammonium chloride, 0.2 mmol lead chloride, 0.4 mmol oleyl amine, 1 mL propionic acid via a dropper and 10 mL dimethyl sulfoxide were added thereto, then to which ultrasonic treatment is performed for 5 minutes to obtain a clear colorless solution, which was then filtered with a 0.2 μm-pore size PTFE filter head to obtain clear filtrate as a precursor solution.

(3) Preparation of a second solvent

Another 10 mL isotope vial was taken, to which 10 mL n-heptane was then added, and placed on a magnetic mixer to be fast stirred for next operation:

(4) Preparation of quantum dot emulsion

The precursor solution was drawn via a microsyringe and added into n-heptane dropwise which was being fast stirred in step (3) while monitored under the ultraviolet lamp, until that the precursor solution was completely added.

(5) Demulsification 7 mL n-butanol was added to the solution obtained in step (4) and transferred to a centrifuge tube to be centrifuged at 7500 rpm for 10 minutes. After supernatant was poured out, the precipitate was CH$_3$CHONH$_3$PbCl$_3$ nanowires.

Embodiment 19

This embodiment adopted phenylethylamine as a surface ligand, N-methyl pyrrolidinone as the first solvent and n-heptane as the second solvent for making CH$_3$NH$_3$PbCl$_3$ quantum dot by the following steps:

(1) Preparation of methylammonium bromide

The method for making methylammonium bromide was the same as that described above;

(2) Preparation of a precursor solution before reaction

A 10 mL isotope vial was taken, 0.2 mmol methylammonium bromide, 0.2 mmol lead chloride, and then 0.4 mmol phenylethylamine, 1 mL propionic acid via a dropper and 1 mL N-methyl pyrrolidinone were added thereto, then to which ultrasonic treatment is performed for minutes to obtain a clear colorless solution that was then filtered with 0.2 μm-pore size PTFE filter head to obtain clear filtrate as a precursor solution before reaction;

(3) Preparation of a second solvent

Another 10 mL isotope vial was taken, to which 10 mL n-heptane was then added, and placed on a magnetic mixer to be fast stirred for next operation:

(4) Preparation of quantum dot emulsion

The precursor solution was drawn via a microsyringe and added into n-heptane dropwise which was being fast stirred in step (3) while monitored under the ultraviolet lamp, until that the precursor solution was completely added.

(5) Demulsification 7 mL n-butanol was added to the solution obtained in step (4) and transferred to a centrifuge tube to be centrifuged at 7500 rpm for 10 minutes. After supernatant was poured out, the precipitate was CH$_3$NH$_3$PbCl$_3$ quantum dot.

In the description of the present invention, it shall be understood that orientation or positional relationships indicated by terms such as "center", "upper", "lower", "front". "rear", "left", "right", "vertical", "horizontal", "top", "bottom". "inner" and "outer" are based on the orientation or positional relationship as shown in the drawings, and these terms are merely for ease of the description of the present invention and simplifying the description, rather than indicating or implying that the specified device or element must have a particular orientation and be constructed and operated in a particular orientation, and thus cannot be construed as limitation of the present invention.

It shall be noted that the terms "first" and "second" are merely for the purpose of description and cannot be construed as indicting or implying a relative importance or implying the number of the specified technical features. Thus, features defined by "first" or "second" may explicitly or implicitly comprise one or a plurality of said features. Further, in the description of the present invention, unless specified otherwise, "a plurality of" means two or more.

What is claimed is:

1. A hybridized perovskite quantum dot material, comprising:
   a kernel, formed by R$_1$NH$_3$AB$_3$ or (R$_2$NH$_3$)$_2$AB$_4$, wherein R$_1$ is a methyl group, R$_2$ is an organic molecular group, A is one or more selected from a group consisting of Ge, Sn, Pb, Sb, Bi, Cu and Mn, B is one or more selected from a group consisting of Cl, Br and I, A and B form a coordination octahedral structure, and R$_1$NH$_3$ or R$_2$NH$_3$ is filled in gaps of the coordination octahedral structure; and
   a surface ligand formed on a surface of the kernel and the surface ligand being an organic acid or organic amine.

2. The hybridized perovskite quantum dot material according to claim 1, wherein the surface ligand is divergent, wrapping out of the surface of the kernel.

3. The hybridized perovskite quantum dot material according to claim 1, wherein R$_2$ is a long-chain organic molecular group.

4. The hybridized perovskite quantum dot material according to claim 1, wherein the surface ligand is an organic acid or a long-chain organic amine.

5. The hybridized perovskite quantum dot material according to claim 4, wherein the organic acid comprises a saturated or an unsaturated alkyl acid with at least three carbon atoms.

6. The hybridized perovskite quantum dot material according to claim 4, wherein a molecular formula of the long-chain organic amine is $RNH_2$, and R is a saturated linear or branched alkyl group, or an unsaturated linear or a branched alkyl group.

7. The hybridized perovskite quantum dot material according to claim 4, wherein the long-chain organic amine is an alkyl or aryl amine with from 4 to 24 carbon atoms.

8. A hybridized perovskite quantum dot material, comprising:
   a kernel, formed by $R_1NH_3AB_3$ or $(R_2NH_3)_2AB_4$, wherein A and B form a coordination octahedral structure, $R_1NH_3$ or $R_2NH_3$ is filled in gaps of the coordination octahedral structure, $R_1$ is methyl, $R_2$ is a long-chain organic molecular group, A is one or more selected from a group consisting of Ge, Sn, Pb, Sb, Bi, Cu and Mn, and B is one or more selected from a group consisting of Cl, Br and I; and
   a surface ligand that is divergent, wrapping out of the surface of the kernel, and wherein the surface ligand is an organic acid or a long-chain organic amine.

9. The hybridized perovskite quantum dot material according to claim 8, wherein the organic acid is a saturated alkyl acid that its formula is $C_nH_{2n+1}COOH$ (n≥2), or an unsaturated alkyl acid that its formula is $C_nH_{2n-1}COOH$ (n≥2).

10. The hybridized perovskite quantum dot material according to claim 8, wherein a molecular formula of the long-chain organic amine is $RNH_2$, and R is a saturated linear or a branched alkyl group, or an unsaturated linear or a branched alkyl group.

11. The hybridized perovskite quantum dot material according to claim 8, wherein the long-chain organic amine is an alkyl or aryl amine with from 4 to 24 carbon atoms.

* * * * *